United States Patent
Ochi et al.

(10) Patent No.: US 9,845,529 B2
(45) Date of Patent: Dec. 19, 2017

(54) ELECTRODE AND METHOD FOR PRODUCING SAME

(71) Applicant: Kobe Steel, Ltd., Kobe-shi (JP)

(72) Inventors: Mototaka Ochi, Kobe (JP); Yoko Shida, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 15/023,609

(22) PCT Filed: Nov. 12, 2014

(86) PCT No.: PCT/JP2014/079969
§ 371 (c)(1),
(2) Date: Mar. 21, 2016

(87) PCT Pub. No.: WO2015/072485
PCT Pub. Date: May 21, 2015

(65) Prior Publication Data
US 2016/0340773 A1     Nov. 24, 2016

(30) Foreign Application Priority Data

Nov. 12, 2013 (JP) ................................. 2013-234388
May 30, 2014 (JP) ................................. 2014-113283

(51) Int. Cl.
*G06F 3/041* (2006.01)
*G06F 3/045* (2006.01)
(Continued)

(52) U.S. Cl.
CPC .......... *C23C 14/3414* (2013.01); *C22C 21/00* (2013.01); *C22C 22/00* (2013.01);
(Continued)

(58) Field of Classification Search
CPC .......... G06F 2203/04103; G06F 3/044; C08L 65/00; C09J 125/18
See application file for complete search history.

(56) References Cited

U.S. PATENT DOCUMENTS

2006/0181198 A1   8/2006   Gotoh et al.
2009/0176113 A1   7/2009   Gotoh et al.
(Continued)

FOREIGN PATENT DOCUMENTS

JP   2001-174848 A   6/2001
JP   2003-66489 A    3/2003
(Continued)

OTHER PUBLICATIONS

International Search Report and Written Opinion dated Feb. 3, 2015 for PCT/JP2014/079969 filed on Nov. 12, 2014.

*Primary Examiner* — Nan-Ying Yang
(74) *Attorney, Agent, or Firm* — Oblon, McClelland, Maier & Neustadt, L.L.P.

(57) ABSTRACT

Provided are: a novel electrode which is suitable for use in an input device as typified by a capacitive touch panel sensor, and which has low electrical resistivity and low reflectance; and a method for producing this electrode. This electrode has a multilayer structure comprising a first layer that is formed of an Al film or an Al alloy film and a second layer that is partially nitrided and is formed of an Al alloy containing Al and at least one element selected from the group consisting of Mn, Cu, Ti and Ta.

15 Claims, 13 Drawing Sheets

(51) Int. Cl.
*C23C 14/34* (2006.01)
*C22C 21/00* (2006.01)
*C22C 22/00* (2006.01)
*G06F 3/044* (2006.01)
*C23C 14/00* (2006.01)
*C23C 14/16* (2006.01)
*H01J 37/34* (2006.01)

(52) U.S. Cl.
CPC ........ *C23C 14/0036* (2013.01); *C23C 14/165* (2013.01); *G06F 3/044* (2013.01); *H01J 37/3429* (2013.01); *G06F 2203/04103* (2013.01)

(56) References Cited

U.S. PATENT DOCUMENTS

| | | | |
|---|---|---|---|
| 2010/0053759 A1* | 3/2010 | Inoue | C09D 1/00 359/601 |
| 2010/0164896 A1 | 7/2010 | Nakayama et al. | |
| 2010/0177383 A1* | 7/2010 | Kamada | B32B 17/10036 359/485.02 |
| 2011/0024761 A1* | 2/2011 | Kawakami | H01L 21/2236 257/59 |
| 2012/0091591 A1 | 4/2012 | Gotoh et al. | |
| 2013/0155011 A1 | 6/2013 | Kim et al. | |
| 2013/0215067 A1 | 8/2013 | Hwang et al. | |
| 2014/0020810 A1 | 1/2014 | Nakayama et al. | |

FOREIGN PATENT DOCUMENTS

| | | |
|---|---|---|
| JP | 2010-79240 A | 4/2010 |
| JP | 2010-170530 A | 8/2010 |
| JP | 2013-127792 A | 6/2013 |
| JP | 2013-129183 A | 7/2013 |
| JP | 2013-222123 A | 10/2013 |
| JP | 2013-235315 A | 11/2013 |
| KR | 10-2008-0084790 A | 9/2008 |
| KR | 10-2012-0040679 A | 4/2012 |

* cited by examiner

IZO-50nm
/Al-77at%Mn-N-50nm
/Al-1.0Cu-1.0Mn-250nm
/GLASS SUBSTRATE

IZO-50nm
/Al-12at%Cu-N-50nm
/Al-1.0Cu-1.0Mn-250nm
/GLASS SUBSTRATE

IZO-50nm
/Al-12at%Cu-N-50nm
/Ag-250nm
/GLASS SUBSTRATE

ELECTRODE AND METHOD FOR PRODUCING SAME

TECHNICAL FIELD

The present invention relates to an electrode for use in an input device, or the like, and a method for producing the same. Below, descriptions will be given by taking a touch panel sensor as a representative example of an input device. However, the present invention is not limited thereto.

BACKGROUND ART

A touch panel sensor is connected to the display screen of a display device such as a liquid crystal display device or an organic EL device as an input device to be used. Touch panel sensors are used for the operation screens of ATMs of a bank, vending machines, car navigation systems, PDAs (Personal Digital Assistants), and copying machines, and the like because of the ease of use, and, have been widely used for even cellular phones and tablet PCs in recent years. As the detection systems of the input point, mention may be made of a resistance film system, an electrostatic capacitance system, an optical system, an ultrasonic surface elastic wave system, a piezoelectric system, and the like. Out of these, the electrostatic capacitance system is preferably used for a cellular phone or a tablet PC because of the good responsivity, the low cost, the simple structure, and the like.

An electrostatic capacitance system touch panel sensor has, as one example, a structure in which transparent electrodes in two directions are arranged orthogonal to each other on a transparent substrate such as a glass substrate, and the surface is covered with an insulator such as protective glass. When the surface of the touch panel sensor of the configuration described above is touched with a finger, a pen, or the like, the electrostatic capacitance between both transparent electrodes changes. For this reason, by sensing a change in amount of the current flowing via the electrostatic capacitance, it is possible to grasp the touched position.

As the transparent substrate for use in the touch panel sensor of the configuration described above, a substrate only for a touch panel sensor may be used. However, a transparent substrate for use in a display device can also be used. Specifically, for example, mention may be made of a color filter substrate for use in a liquid crystal display device, a glass substrate for use in an organic EL device, or the like. Use of such a transparent substrate for a display device can support the characteristics required of the touch pane sensor such as the improvement of the contrast ratio of a display, the improvement of the brightness, and the reduction of the thickness of a smart phone, or the like.

Recently, in order to improve the tough sensitivity, and to reduce the noise when the transparent electrode is used, use of a low-resistance metal electrode as the electrode has been studied.

However, a metal electrode is high in reflectivity, and is visible to users' naked eyes, namely, is visually recognized, unfavorably resulting in a reduction of the contrast ratio. For this reason, when a metal electrode is used, there is adopted a method in which the metal film is subjected to a blackening treatment to reduce the reflectivity, or other methods.

For example, Patent Literature 1 describes the following method: in order to solve the problem of visibility in a bridge electrode interconnecting conductive transparent pattern cells, a bridge electrode is formed using a black conductive material on an insulation layer formed at the conductive pattern cells. Specifically, there is exemplified a method in which as the bridge electrode, a metal of Al, Au, Ag, Sn, Cr, Ni, Ti, or Mg is blackened into an oxide, a nitride, a fluoride, or the like by the reaction with a chemical. However, Patent Literature 1 only discloses the reflectivity reducing technology of the bridge electrode by the blackening treatment of a metal, and does not pay attention to the reduction of the electrical resistivity at all. Accordingly, the exemplifications include those with a high electrical resistivity such as metal oxides, and cannot be applied to electrodes for low electrical resistivity wiring. Further, the Patent Literature 1 also includes high-reactivity and dangerous substances such as a nitride of Ag and an oxide of Mg, which is poor in utility.

CITATION LIST

Patent Literature

Patent Literature 1: Japanese Unexamined Patent Application Publication No. 2013-127792

SUMMARY OF INVENTION

Technical Problem

The present invention was completed in view of the foregoing circumstances. It is an object thereof to provide an electrode for use in an input device represented by, preferably, a touch panel sensor of an electrostatic capacitance system, which is a novel electrode low in sheet resistance, and low in reflectivity; and a method for producing the same.

Solution to Problem

The electrode of the present invention capable of solving the problem has the gist in having a lamination structure of a first layer including an Al film or an Al alloy film, and a second layer including an Al alloy including Al; and at least one element selected from the group consisting of Mn, Cu, Ti, and Ta, and being partially nitrided.

In a preferred embodiment of the present invention, the lamination structure further has a transparent conductive film as a third layer.

In a preferred embodiment of the present invention, the second layer has extinction coefficients of 0.15 or more at a wavelength of 450 nm, a wavelength of 550 nm, and a wavelength of 650 nm.

In a preferred embodiment of the present invention, the second layer includes a nitrogen atom in an amount of 14 at % or more and 57 at % or less.

In a preferred embodiment of the present invention, the electrode has a Mo film on at least one surface of the first layer.

In a preferred embodiment of the present invention, the Al alloy described for the second layer includes Al; and at least one element selected from the group consisting of Mn and Cu.

In a preferred embodiment of the present invention, the third layer is a transparent conductive film formed of an oxide including at least In and Sn, or a transparent conductive film formed of an oxide including at least In and Zn.

In a preferred embodiment of the present invention, the electrical resistivity of the first layer is 20 μΩ·cm or less.

In a preferred embodiment of the present invention, the Al alloy film of the first layer includes Al; and at least one element selected from the group consisting of Nd, Cu, Mn, Ta, Ge, La, Zr, and Ni.

In a preferred embodiment of the present invention, the electrode is excellent in wet etching processability using a phosphoric nitric acetic acid based etchant.

In a preferred embodiment of the present invention, the film thickness of the first layer is 50 to 400 nm.

The present invention also includes an input device having the electrode according to any of the items described above.

In a preferred embodiment of the present invention, the input device is a touch panel sensor.

The present invention also includes a sputtering target for use in deposition of the second layer forming the electrode according to any of the items described above, the sputtering target including at least one element selected from the group consisting of Mn, Cu, Ti, and Ta, and a balance: Al and unavoidable impurities.

Further, a method for producing the electrode which could solve the foregoing problems has a gist in that the second layer is deposited by a reactive sputtering method including a nitrogen gas.

Advantageous Effects of the Invention

The electrode in accordance with the present invention has a lamination structure of: a first layer including an Al film or an Al alloy film, and a second layer including an Al alloy including Al; and at least one element selected from the group consisting of Mn, Cu, Ti, and Ta, and being partially nitrided. For this reason, both of a low sheet resistance and a low reflectivity can be attained. Accordingly, when the present inventive electrode of the lamination structure is used as an electrode for an input device, there can be obtained an input device including an electrode combining a low sheet resistance, and a low reflectivity which were impossible to achieve with a metal film alone.

DESCRIPTION OF EMBODIMENTS

First, a description will be given to the liquid crystal display device portion in a touch panel structure. Incidentally, below, as a display, namely, a display device, a liquid crystal display device will be taken as an example. However, the present invention is not limited thereto, and is also applicable to, for example, an organic EL device as another display device.

Figure 1:
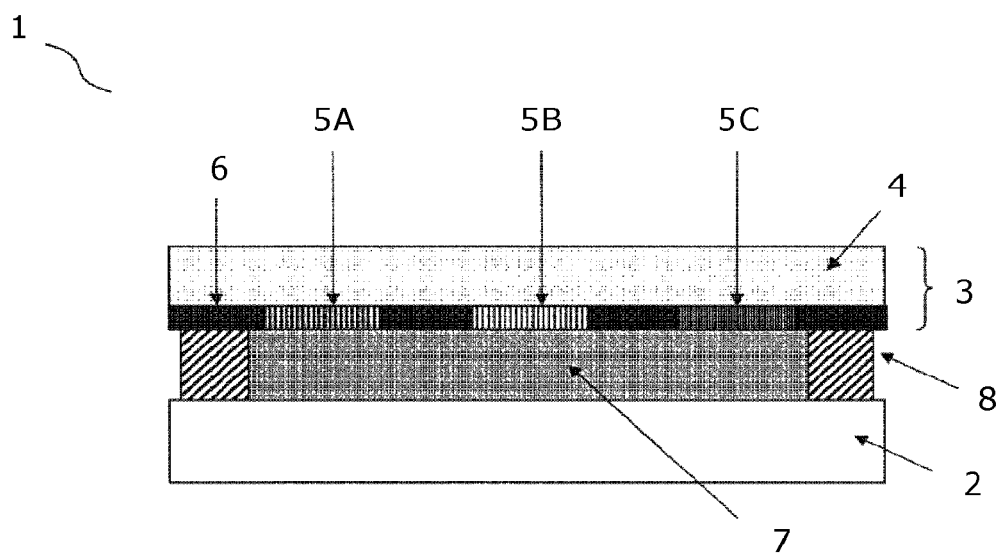
FIG. 1 is a schematic cross sectional view schematically showing a configuration of a general liquid crystal display device.

FIG. 1 is a schematic cross sectional view schematically showing a configuration of a general liquid crystal display device 1. The liquid crystal display device 1 shown in FIG.

1 has a TFT (Thin Film Transistor) substrate 2. The TFT substrate 2 is, for example, an array substrate. To the TFT substrate 2, an opposing substrate 3 is arranged in opposition. The opposing substrate 3 is, for example, a color filter (CF, Color Filter) substrate 4, and is arranged on the viewed side. In the opposing substrate 3, green, blue, and red color filters 5A, 5B, and 5C, a black matrix (BM) 6, and the color filter substrate 4 are formed. A liquid crystal layer 7 doped with a liquid crystal is interposed between the TFT substrate 2 and the opposing substrate 3. The liquid crystal layer 7 is sealed by a liquid crystal sealing material 8. Further, although not shown, a polarization plate, a phase difference plate, and the like are provided at the external surface of the opposing substrate 3. Further, although not shown, a backlight unit, and the like are disposed on the side opposite to the viewed side of the liquid crystal display panel, namely, under the TFT substrate 2 in FIG. 1.

The input device including the electrode of the present invention is arranged above the color filter substrate 4, namely, on the operation surface side of the liquid crystal display device 1.

Below, preferred embodiments of the electrode of the present invention will be described while exemplifying the pattern of the input device. Particularly, the electrode of the present invention will be described while exemplifying Embodiments 1 and 2 in the input device example-1, and Embodiments 3 and 4 in the input device example-2.

(1) Input Device Example-1

Figure 2:
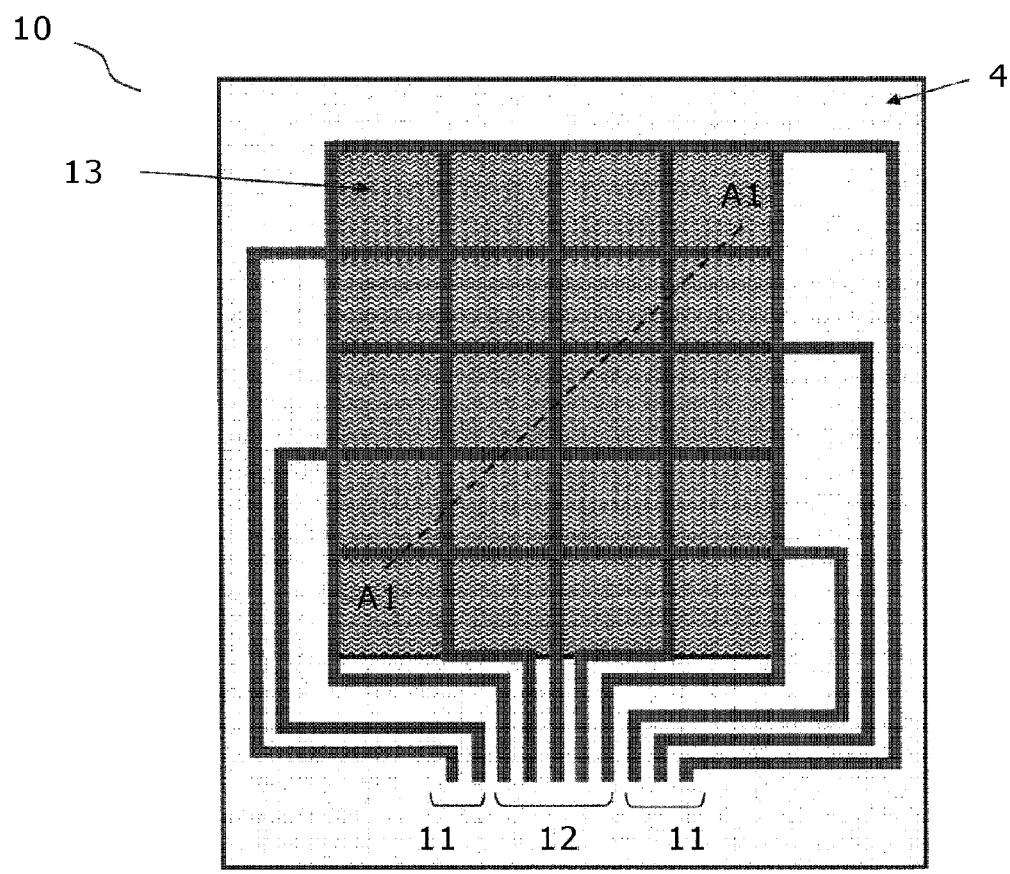
FIG. 2 is a schematic plan view showing one example of an input device in an electrostatic capacitance type touch panel.

FIG. 2 is a schematic plan view showing one example of the input device in an electrostatic capacitance type touch panel. An input device 10 shown in FIG. 2 has wires in a lattice form. Particularly, at the top of the color filter substrate 4 which is a kind of a transparent substrate, there are provided a plurality of metal electrodes 11 for driving arranged in the X direction on a row basis; and a plurality of metal electrodes 12 for detection arranged in the Y direction on a column basis. The driving electrodes 11 and the detecting electrodes 12 are provided at different layers, respectively, and are insulated from each other by an insulation layer 13.

With the configuration of FIG. 2, the touch position of a user is detected by a change in capacitance generated between the driving electrode 11 and the detecting electrode 12 due to the application of a voltage to the driving electrode 11.

With the present configuration, metal electrodes each having a small resistance are used as the driving electrodes 11 and the detecting electrodes 12. Accordingly, respective electrodes can be each formed as a narrow-width wire. For this reason, the present configuration has a feature of being capable of sufficiently increasing the transmittance of the active area.

Embodiment 1: Cross Sectional Structure Example-1 in Input Device Example-1

Figure 3:
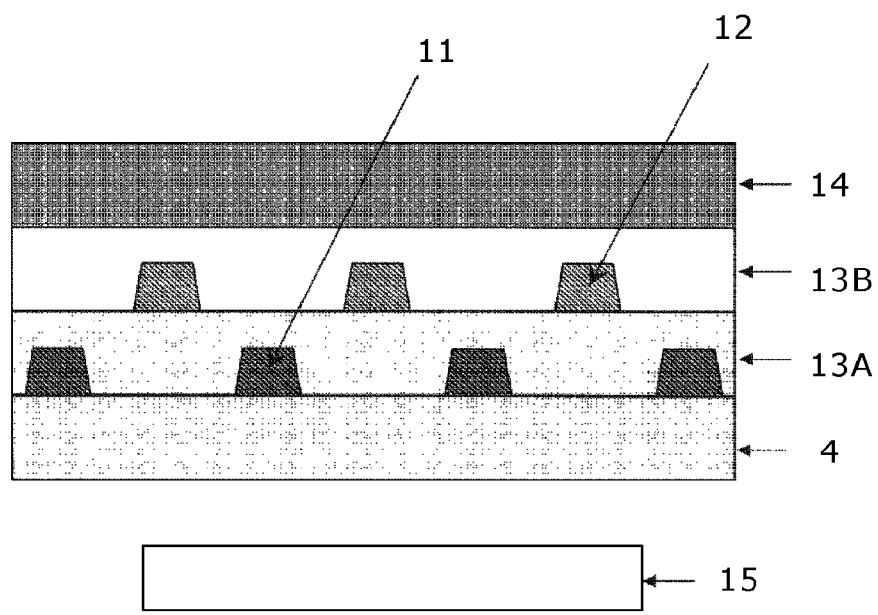
FIG. 3 is a schematic cross sectional view showing one example of the cross sectional structure along a dotted line A1-A1 of FIG. 2.

As one example of the cross sectional structure along a dotted line A1-A1 of FIG. 2, mention may be made of the cross sectional structure of FIG. 3. FIG. 3 is a schematic cross sectional view showing one example of the structure in which the input device 10 of FIG. 2 is mounted at the color filter substrate 4 of the liquid crystal display device 1 shown in FIG. 1.

As shown in FIG. 3, at the top of the color filter substrate 4, the plurality of first metal electrodes 11 arranged in the X direction on a row basis are arranged at the same layer. Further, the plurality of second metal electrodes 12 arranged in the Y direction on a row basis are arranged at a different layer from that for the first metal electrodes 11. Although not shown, the plurality of first metal electrodes 11 and second metal electrodes 12 are preferably arranged immediately on a black matrix in order to prevent the reduction of the visibility of the display device. A first insulation layer 13A and a second insulation layer 13B are arranged between the plurality of first metal electrodes 11, between the plurality of second metal electrodes 12, and between the first metal electrodes 11 and the second metal electrodes 12. For the first insulation layer 13A and the second insulation layer 13B, for example, a known translucent insulation resin can be used. Then, a cover glass 14 is provided so as to cover the surface provided with the second insulation layer 13B. Incidentally, 15 in FIG. 3 denotes a backlight.

In FIG. 3, as the first metal electrode 11 or the second metal electrode 12, the electrode of the present invention can be preferably used. Below, a preferred embodiment of the electrode of the present invention will be described in details while showing the preferable specific examples in FIGS. 4, 5, and 6 with the first metal electrodes 11 in FIG. 3 as an example. However, the electrodes of the present invention are not limited to the drawings. Incidentally, in FIGS. 4, 5, and 6, the substrate is set as not the color filter substrate 4 of FIG. 3 but a transparent substrate 24. It is intended that the substrate has no particular restriction. When the electrode of the present invention is applied to a liquid crystal display device, a color filter substrate is used as a transparent substrate. However, when the electrode of the present invention is used for an organic EL display device, a color filter substrate is often unnecessary, so that a transparent substrate such as a glass substrate like a cover glass can be used. The kind of the transparent substrate for use in the present invention will be described in details later.

Figure 4:
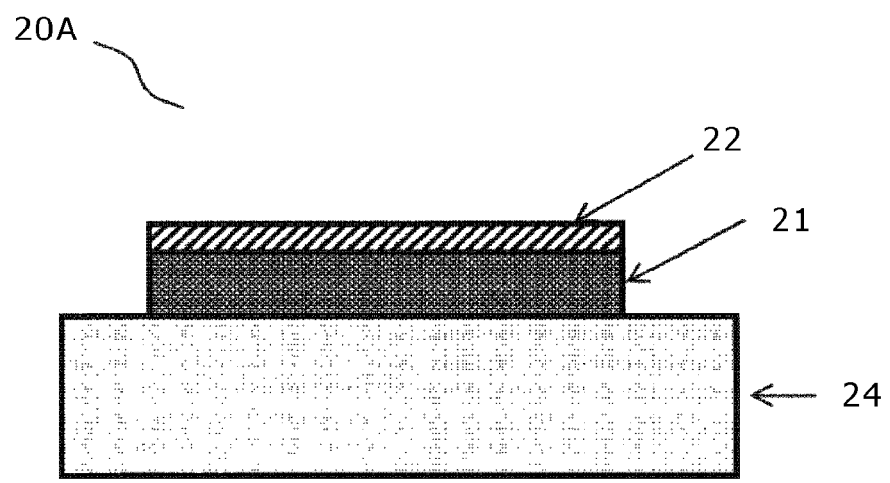
FIG. 4 is a schematic cross sectional view showing one example of structure of the electrode of the present invention, namely, an electrode in accordance with Embodiment 1A.

Embodiment 1A: Electrode Including a Two-Layer Structure of First Layer and Second Layer FIG. 4 is a schematic cross sectional view showing one example of structure of the electrode of the present invention. In an electrode structure 20A of FIG. 4, a substrate formed of glass, plastic, or the like can be used for the transparent substrate 24. On the transparent substrate 24, at least a first layer 21 including an Al film or an Al alloy film, and a second layer 22 including a partially nitrided Al alloy are formed. In the lamination structure, the first layer 21 acts as a wiring film for use in the electrode, and the second layer 22 acts as an optical adjustment layer.

Figure 5:
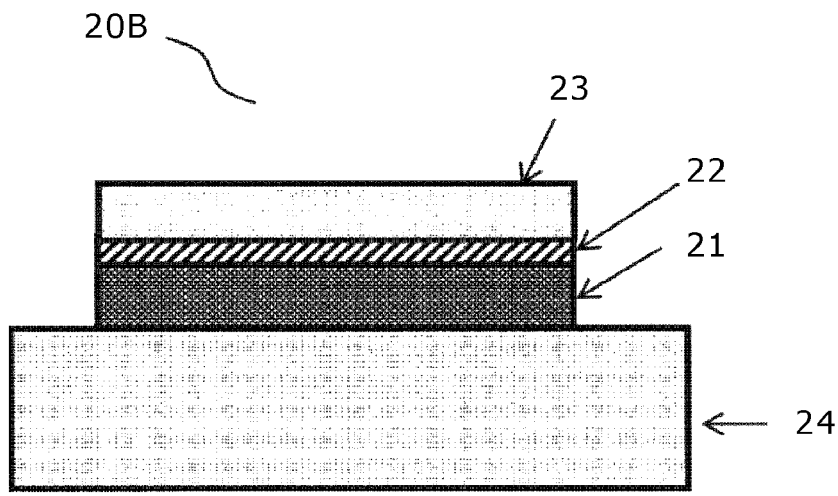
FIG. 5 is a schematic cross sectional view showing another example of structure of the electrode of the present invention, namely, an electrode in accordance with Embodiment 1B.

Embodiment 1B: Electrode of a Three-Layer Structure Including First Layer, Second Layer, and Third Layer FIG. 5 is a schematic cross sectional view showing another example of structure of the electrode of the present invention. In an electrode structure 20B of FIG. 5, the electrode has a lamination structure in which at least a first layer 21 formed of an Al film or an Al alloy film, a second layer 22 including a partially nitrided Al alloy, and a third layer 23 formed of a transparent conductive film are formed. In the lamination structure, the first layer 21 acts as a wiring film for use in the electrode, and the second layer 22 and the third layer 23 each act as an optical adjustment layer. Incidentally, in the lamination structure, the order of the second layer 22 and the third layer 23 may be reversed.

Below, respective layers of the first layer 21, the second layer 22, and the third layer 23 will be described in details. First, the first layer will be described.

The first layer for use in the present invention is formed of an Al film or an Al alloy film (below, which may be abbreviated as an Al/Al alloy film). Use of the Al/Al alloy film as a wiring metal improves the wet etching processability by a phosphoric nitric acetic acid based etchant. Herein, the phosphoric nitric acetic acid based etchant means a mixed solution including at least phosphoric acid, nitric acid, and acetic acid. In contrast, when Ag or Cu other than those described above, or an alloy thereof is used as the first layer, a low sheet resistance can be obtained upon forming a lamination structure. However, the wet etching processability to the phosphoric nitric acetic acid based etchant is inferior, and the etching rate becomes higher. Accordingly, a good patterning shape cannot be obtained (see FIG. 23 described later).

Specifically, the Al/Al alloy film with an electrical resistivity of the first layer single film of 20 $\mu\Omega\cdot cm$ or less is preferably used. The electrical resistivity of the first layer is sufficiently lower than the electrical resistivity of the second layer of 1 $\mu\Omega\cdot cm$ or less, and the electrical resistivity of the third layer of several hundreds $\mu\Omega\cdot cm$. For this reason, the flow of electric charges is dominant at the first layer, so that the sheet resistance of the lamination structure is also reduced.

The Al alloy film of the first layer for use as an electrode layer preferably includes at least one or more of a refractory metal element and a rare-earth metal element as alloy components. As a result, a heat aggregation suppressing effect is exerted. Herein, the refractory metals mean metals with a melting point of 1200° C. or more such as Mo, Ti, Ta, W, Cr, and Mn. Further, the rare-earth metal elements are intended to include lanthanoid elements, namely, 15 elements of from La to Lu, and scandium and yttrium. Of these, particularly, Al alloys including refractory metal elements of Ti, Ta, and Mn are used. As a result, the heat resistance is enhanced, and, further, the corrosion resistance against the corrosion due to halogen, salt water, or the like which may be present according to use environment is also improved. Further, elements having an electrode potential noble to Al, such as Cu, Ge, Zr, and Ni are also preferably included as alloy components. As a result, when the structure is used in which the Al alloy electrode and the transparent electrode are in contact with each other as in, for example, Embodiment 3 described later, the cell reaction at the connection interface between the Al alloy thin film and the transparent electrode can be suppressed, thereby to suppress the electrolytic corrosion.

Out of these, more preferable is an Al alloy film including at least one element selected from the group consisting of Nd, Cu, Mn, Ta, Ge, La, Zr, and Ni.

The alloy element content of the Al alloy film of the first layer is preferably set as follows. Namely, as the lower limit of the alloy element content, at least one or more elements of the refractory metal elements, rare-earth metal elements, and elements having an electrode potential more noble than that of Al is preferably included in a total amount of 0.1 at % or more, and more preferably 0.2 at % or more in order to ensure the heat resistance and the corrosion resistance.

On the other hand, the upper limit of the alloy element content is preferably set as follows in order to implement a low sheet resistance. Namely, when the rare-earth metal elements or the refractory metal elements are contained, the upper limit of the total content of the rare-earth metal elements, and the upper limit of the total content of the refractory metal elements are preferably set at 2 at % or less, respectively, and more preferably set at 1 at % or less, respectively. When the elements having an electrode potential more noble than that of Al are contained, the upper limit of the total content of the elements is preferably set at 3 at % or less, and more preferably 2 at % or less. Whereas, the total content of the refractory metal elements, the rare-earth metal elements, and the elements having an electrode potential more noble than that of Al is set at preferably 3 at % or less, and more preferably 2 at % or less.

The film thickness of the first layer is preferably 50 nm or more because the sheet resistance value as in a lamination structure is reduced to a prescribed range. When the film thickness of the first layer is smaller than 50 nm, it is difficult to obtain a desired sheet resistance value. More preferably, the film thickness of the first layer is 100 nm or more. However, when the film thickness of the first layer exceeds 400 nm, the wet etching processability by a phosphoric nitric acetic acid based etchant, and the productivity may be reduced. For this reason, the film thickness of the first layer is preferably set at 400 nm or less, and more preferably 300 nm or less.

The second layer for use in the present invention is a layer in which an Al alloy (which may be hereinafter referred to as an Al—X alloy) including Al; and at least one element selected from the group consisting of Mn, Cu, Ti, and Ta (which may be hereinafter referred to as X group elements) is partially nitrided (which may be hereinafter referred to as an Al—X alloy-N layer). Use of an Al alloy including at least one element selected from the group consisting of Mn and Cu as the Al—X alloy is preferable from the viewpoint of the improvement of the corrosion resistance against halogen, salt water, or the like.

The second layer preferably satisfies an extinction coefficient of 0.15 or more at a wavelength of 450 nm, a wavelength of 550 nm, and a wavelength of 650 nm. Further, the second layer preferably has a refractive index of 1.0 or more at a wavelength of 450 nm, a wavelength of 550 nm, and a wavelength of 650 nm. By using an Al—X alloy-N layer having such a high extinction coefficient and a high refractive index as the second layer, it is possible to reduce the reflectivity of the whole lamination structure.

Further, the electrical resistivity of the second layer is preferably 1.0 $\mu\Omega\cdot cm$ or less. The electrical resistivity of the second layer is thus controlled. As a result, when the electrode of the present invention is applied to, for example, a touch panel, and bonded with an IC (Integrated Circuit) for receiving a touch sensor signal, the series resistance can be sufficiently reduced, and the signal intensity is not adversely affected. When the electrical resistivity of the second layer is larger than 1.0 $\mu\Omega\cdot cm$, the contact with the IC may be adversely affected according to the film thickness of the lamination structure. This results in a smaller signal reception intensity, and more susceptibility to a noise, and the like.

In contrast, when a metal oxide is used as in Patent Literature 1, the electrical resistivity increases even if the reflectivity can be reduced. Alternatively, when not the Al—X alloy but an Al—N layer in which pure Al is partially nitrided is used, the extinction coefficient is reduced, and the reflectivity of the whole lamination structure is reduced (see Example described later).

In the present description, "being partially nitrided" means the following: it is essential only that at least a nitrogen atom is included in the Al alloy so as to effectively exert desirable effects; and a nitride satisfying the stoichiometric composition is not necessarily required.

For example, in the case where the nitride of the Al—X alloy is expressed as Al—X—Ny, mention may be made of the following: the content ratio y of nitrogen atoms when the total sum of Al atoms, X group element atoms, and nitrogen atoms is the denominator is set within the range of 14 at % or more and 57 at % or less. Below, the "content ratio y of nitrogen atoms" may be referred to as "nitrogen atom ratio". As shown in Nos. D, 10, and W of Table 1 of Example described later, when the nitrogen atom ratio is 58 at %, a desired extinction coefficient may not be obtained. However, by setting the nitrogen atom ratio at 57 at % or less, it becomes easier to obtain a desired extinction coefficient. In order to obtain a desired extinction coefficient with more reliability, the lower limit of the nitrogen atom ratio is preferably set at 20 at % or more. Further, the upper limit is desirably set at preferably 56 at % or less, more preferably 50 at % or less, and further preferably 40 at % or less. Al forms AlN in which Al and nitrogen atoms combine with each other at 1 to 1 by nitriding. For this reason, nitriding to the stoichiometric composition requires nitrogen atoms in an amount of 50 at % or more. In the present invention, nitrogen atoms in such an amount as to fall short of the chemical stoichiometric composition is preferably included. In other words, the following state is more preferable: metal Al or X group elements are dispersed as metals in the film, and Al or X group elements in a metal state; and nitrides of Al or the X group elements are mixed.

The film thickness of the second layer is preferably controlled properly so as to obtain a desired extinction coefficient and a low electrical resistivity according to the extinction coefficient determined based on the composition of the Al—X alloy, or the like. As shown in Table 1 described later, when the same X group elements are included in Al, the higher the content of the X group elements is, the larger the extinction coefficient in the Al—X alloy-N layer is. For this reason, even when the film thickness of the Al—X alloy-N layer is reduced, the reflectivity of the whole lamination structure can be controlled low. Conversely, the lower the content of the X group elements, the smaller the extinction coefficient in the Al—X alloy-N layer is. For this reason, unless the film thickness of the Al—X alloy-N layer is increased, the reflectivity of the whole lamination structure cannot be controlled low. For example, in Examples described later, the extinction coefficients of the nitride of the Al-7 at % Cu alloy (described as "Al-7 at % Cu—N" in Tables 2, 3, 5, and 6) and the nitride of the Al-17 at % Cu alloy (described as "Al-17 at % Cu—N" in Tables 2 and 3) are compared. As a result, as shown in Table 1 described later, the Al-17 at % Cu—N is larger in extinction coefficient than the Al-7 at % Cu—N. For this reason, when Al-17 at % Cu—N with a larger extinction coefficient is used, a low reflectivity as in a lamination structure can be ensured only by setting the film thickness at least more than 10 nm. In contrast, when Al-7 at %-Cu—N with a smaller extinction coefficient is used, a high reflectivity as in a lamination structure cannot be ensured unless the film thickness is set at least more than 100 nm (see Table 2 described later).

The preferable content of the X group elements included in the second layer differs according to the kind of the elements. When the element is Cu, Cu is included in an amount of preferably 5 at % or more and 30 at % or less, and more preferably 7 at % or more and 20 at % or less. When the element is Mn, Mn is included in an amount of preferably 30 at % or more and 80 at % or less, and more preferably 40 at % or more and 80 at % or less. When the element is Ti, Ti is included in an amount of preferably 1 at % or more and 20 at % or less, and more preferably 2 at % or more and 15 at % or less. When the element is Ta, Ta is included in an amount of preferably 5 at % or more and 30 at % or less. Even when the content of each element exceeds the preferable upper limit value, the optical characteristics and the electrical resistivity are satisfied. However, from the viewpoint of readily manufacturing a sputtering target for use in thin film formation, or from the viewpoint of readily performing wiring processing of the lamination film of the first layer, the second layer, and the third layer, the foregoing composition ranges are preferably satisfied.

Further, the nitrogen atom ratio in the second layer, and the content of the X group elements in the Al alloy may be constant, or may be changed, namely, may have a concentration distribution in the direction of film thickness in the second layer. In the present invention, the second layer bears a role as optical adjustment of the lamination structure. Thus, the nitrogen atom ratio and the distribution of the alloy elements in the second layer do not matter so long as a desired extinction coefficient is satisfied.

The third layer for use in the present invention is formed of a transparent conductive film. The third layer is a layer effectively acting in combination with the second layer described above as the optical adjustment layer of the lamination structure in accordance with the present invention. This can implement a low reflectivity. The transparent conductive film has no particular restriction so long as it is generally used in the technical field of the present invention. However, a transparent conductive film formed of an oxide including at least In and Sn, or a transparent conductive film formed of an oxide including at least In and Zn, such as ITO (In—Sn—O) or IZO (In—Zn—O) is preferably used.

The film thickness of the third layer is preferably controlled properly so as to adjust the phase of the reflected light from the first layer and the second layer, and to minimize the reflectivity of the lamination film, and so as to ensure a wet etching processability.

The transparent substrate is generally used in the technical field of the present invention, and has no particular restriction so long as it has transparency. For example, mention may be made of a color filter substrate, a glass substrate forming cover glass, a film substrate, a plastic substrate, or a quartz substrate.

The electrode of the present invention can also include a known film interposed therein for the purpose of further improving a desired low sheet resistance and low reflectivity, or for the purposes of improving other characteristics. Below, preferred embodiments of the inventive electrode formed of a five-layer structure will be described. However, the present invention is not limited thereto.

Figure 6:
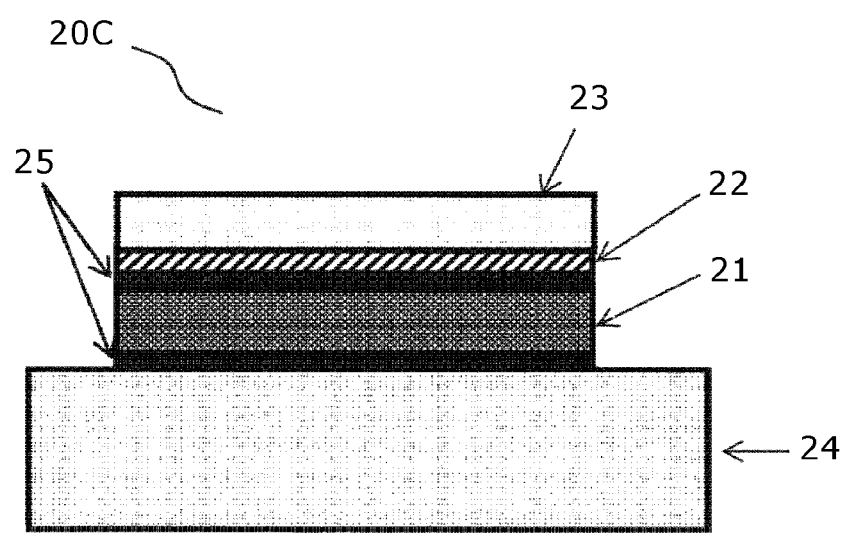
FIG. 6 is a schematic cross sectional view showing a still other example of structure of the electrode of the present invention, namely, an electrode in accordance with Embodiment 1C.

Embodiment 1C: Electrode of Five-Layer Structure of First Layer, Second Layer, Third Layer, and Mo Films FIG. 6 is a schematic cross sectional view showing another example of structure of the electrode of the present invention. The electrode structure 20C is one of the preferred embodiments of the electrode in accordance with the present invention, and is a structure (five-layer structure) obtained by stacking Mo films 25 on and under the Al/Al alloy film forming the first layer 21 in the electrode structure 20B of FIG. 5. Each Mo film 25 is known as a film for improving the characteristics such as the adhesion and the heat resistance, and is also preferably used in the present invention. Incidentally, in FIG. 6, the Mo films 25 are stacked on and under the first layer 21. However, it is also acceptable that the Mo film 25 is formed either on or under the first layer 21.

Below, Embodiments 2 to 4 will be described. However, the first layer 21, the second layer 22, the third layer 23, other layers, and the transparent substrate 20 are the same as those in Embodiment 1.

Embodiment 2: Cross Sectional Structure Example-2 in Input Device Example-1

Figure 7:
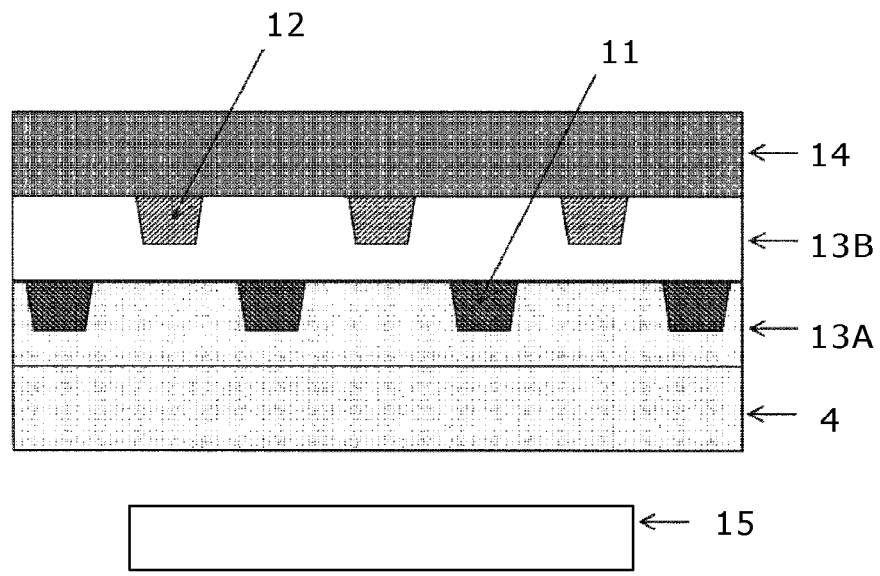
FIG. 7 is another example of the cross sectional structure along the dotted line A1-A1 of FIG. 2.

As another example of the cross sectional structure along the dotted line A1-A1 of FIG. 2, mention may be made of the cross sectional structure of FIG. 7. FIG. 7 is a schematic cross sectional view showing another example of the structure in which the input device 10 of FIG. 2 is mounted at the color filter substrate 4 of the liquid crystal display device shown in FIG. 1.

In FIG. 7, a plurality of second metal electrodes 12 are provided so as to be in contact with the back surface of the cover glass 14; and a plurality of first metal electrodes 11 are provided so as to be not immediately on the color filter substrate 4, but in contact with the second insulation layer 13B. FIG. 7 is different in this point from FIG. 3.

Particularly, in FIG. 7, the first insulation layer 13A is arranged on the color filter substrate 4. The plurality of metal electrodes 11 arranged in the X direction on a row basis are arranged at the top of the first insulation layer 13A without being in contact with the color filter substrate. On the plurality of metal electrodes 11, the second insulation layer 13B is arranged. Further, the plurality of second metal electrodes 12 arranged in the Y direction on a column basis are arranged at the top of the second insulation layer 13B. The plurality of second metal electrodes 12 are arranged so as to be in contact with the cover glass 14.

As the first metal electrodes 11 and the second metal electrodes 12 in FIG. 7, the electrodes of the present invention can be preferably used. Below, a preferred embodiment of the electrode in accordance with the present invention will be described in details while showing the specific examples of the electrode structure in FIGS. 8, 9, and 10 by taking the second metal electrodes 12 of FIG. 7 as an example. A transparent substrate 24 of FIGS. 8 to 10 corresponds to the cover glass 14 of FIG. 7. However, the electrode of the present invention is not limited to the drawings.

Figure 8:
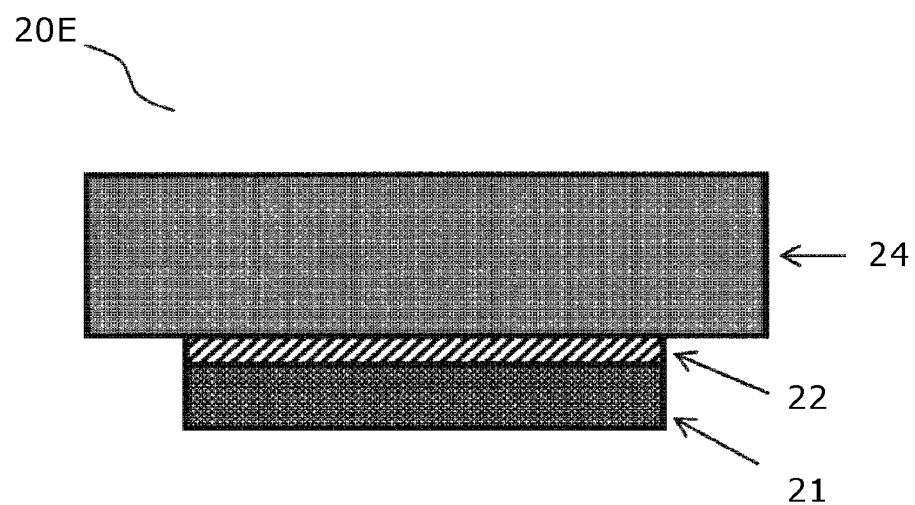
FIG. 8 is a schematic cross sectional view showing another example of structure of the electrode of the present invention, namely, an electrode in accordance with Embodiment 2A.

Embodiment 2A: Electrode Formed of Two-Layer Structure of First Layer and Second Layer FIG. 8 is a schematic cross sectional view showing another example of structure of the electrode of the present invention. In the electrode structure 20E of FIG. 8, at least a second layer 22 formed of a partially nitrided Al alloy and a first layer 21 formed of an Al film or an Al alloy film are formed at the transparent substrate 24. In the present form, the second layer 22 of an optical adjustment layer is provided at a position closer to the transparent substrate 24 side so as to prevent the Al alloy film layer of the first layer 21 from being visually recognized.

Figure 9:
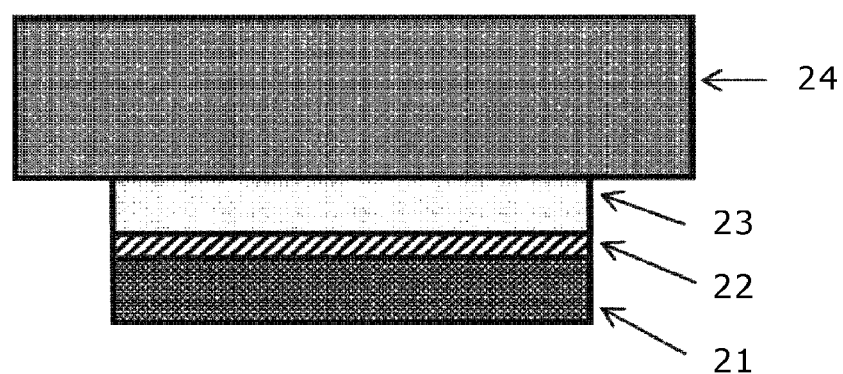
FIG. 9 is a schematic cross sectional view showing a still other example of structure of the electrode of the present invention, namely, an electrode in accordance with Embodiment 2B.

Embodiment 2B: Electrode of Three-Layer Structure Including First Layer, Second Layer, and Third Layer FIG. 9 is a schematic cross sectional view showing another example of structure of the electrode of the present invention. In the electrode structure 20F of FIG. 9, at least a third layer 23 formed of a transparent conductive film, a second layer 22 formed of a partially nitrided Al alloy, and a first layer 21 formed of an Al film or an Al alloy film are formed at the transparent substrate 24. In the lamination structure, the order of the second layer 22 and the third layer 23 may be reversed.

Figure 10:
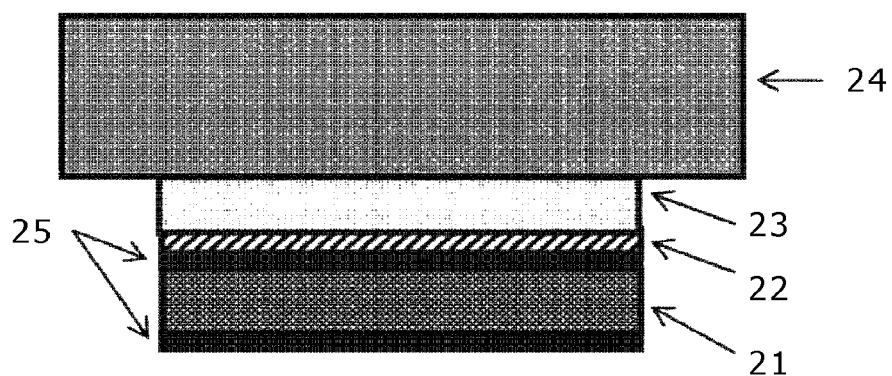
FIG. 10 is a schematic cross sectional view showing a still other example of structure of the electrode of the present invention, namely, an electrode in accordance with Embodiment 2C.

Embodiment 2C: Electrode of Five-Layer Structure of First Layer, Second Layer, Third Layer, and Mo Films FIG. 10 is a schematic cross sectional view showing another example of structure of the electrode of the present invention. The electrode structure 20G of FIG. 10 is one of preferred embodiments of the electrode in accordance with the present invention, and is a five-layer structure in which the Mo films 25 are stacked on and under the Al/Al alloy film forming the first layer 21 in the electrode structure 20F of FIG. 9 described above. The effects of the Mo films 25 are as described by reference to FIG. 6. In FIG. 10, the Mo films 25 are stacked both on and under the first layer 21. However, it is also acceptable that the Mo film 25 is formed either on or under the first layer 21.

(2) Input Device Example-2

Figure 11:
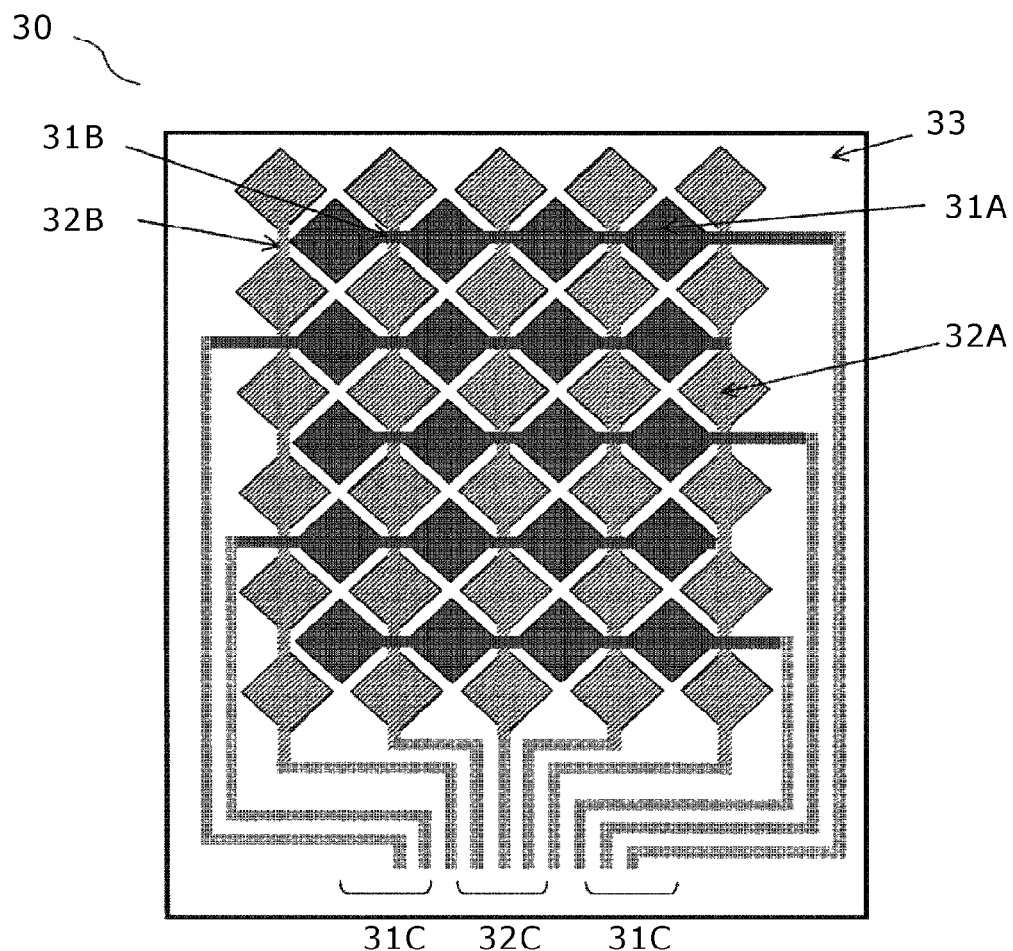
FIG. 11 is a schematic plan view showing another example of the input device in the electrostatic capacitance type touch panel.

FIG. 11 is a schematic plan view showing another example of the input device in an electrostatic capacitance type touch panel. In the input device 30 of FIG. 11, each electrode is a diamond-shaped transparent electrode. Particularly, there are provided a transparent substrate 33, a plurality of first electrode patterns 31A each having a diamond shape arranged in the X direction on a row basis at the top of the transparent substrate 33, a first bridge electrode 31B establishing a connection between the first transparent electrodes 31A, a plurality of second electrode patterns 32A each having a diamond shape arranged in the Y direction on a column basis, and a second bridge electrode 32B establishing a connection between the second transparent electrodes 32A. The first transparent electrode formed of the first electrode patterns 31A and the bridge electrode 31B, and the second transparent electrode formed of the second electrode patterns 32A and the bridge electrode 32B are insulated from each other by an insulation layer not shown. Respective electrode patterns are connected to a control part not shown via peripheral wires 31C and 32C.

With the configuration of FIG. 11, the touch position of a user is detected by a change in capacitance caused between the first electrode patterns 31A and the second electrode patterns 32A when a finger or the like touches the screen.

For the first electrode patterns 31A and the second electrode patterns 32A, in general, a transparent conductive material is used. Specifically, for example, mention may be made of a metal oxide such as ITO (In—Sn—O) or IZO (In—Zn—O).

The present configuration has the following feature: metal electrodes with a small resistance are used for the bridge electrodes 31B and 32B establishing a connection between respective electrode patterns, and the peripheral wires 31C and 32C of the input device; as a result, an input device with a high detecting capability can be formed.

Incidentally, the present configuration is applicable in an input device external type, namely, an outcell structure type liquid crystal display device in which the input device is formed separately from a liquid crystal cell. The outcell type structure has a feature of simple production method because a cover glass, a touch panel, and a display are each formed and bonded individually, and has been widely and commonly used.

Figure 12:
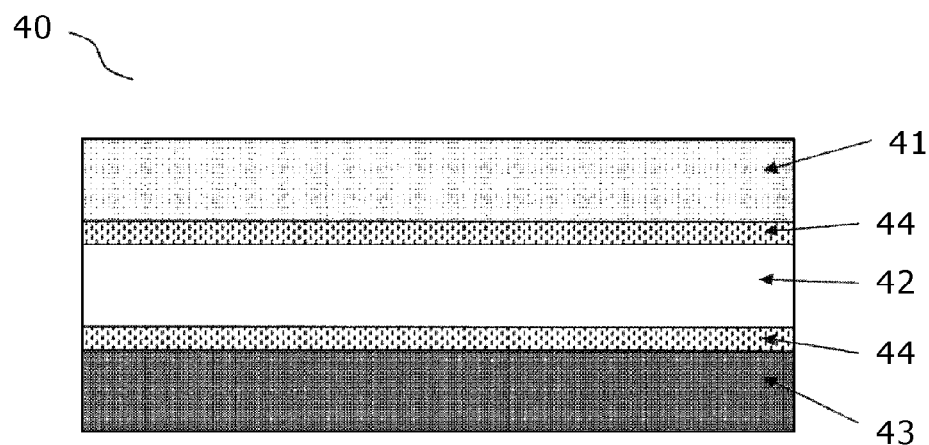
FIG. 12 is a schematic cross sectional view showing one example of the configuration of a liquid crystal display device of an input device external type.

FIG. 12 is a schematic cross sectional view showing one example of the configuration of an input device external type liquid crystal display device. The liquid crystal display device 40 shown in FIG. 12 has a cover glass 41, a touch panel 42, and a display 43. As the touch panel 42, an input device of the structure of FIG. 11 described above can be used. The cover glass 41, the touch panel 42, and the display 43 are each bonded by an adhesion layer 44 such as an OCA (Optically Clear Adhesive, optical transparent both sides) tape, or an OCR (Optical clear resin, optical transparent resin). The display 43 is provided with a color filter substrate, a liquid crystal, a TFT substrate, a backlight unit, and the like, although not shown.

Embodiment 3: Cross Sectional Structure Example-1 of Input Device Example-2

Figure 13:
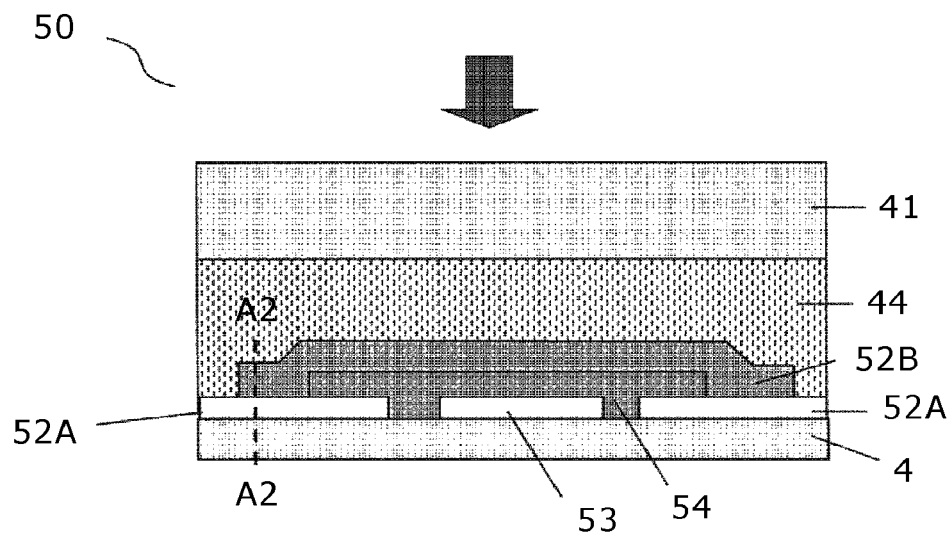
FIG. 13 is a schematic cross sectional view showing one example of the cross sectional structure of FIG. 12.

As one example of the cross sectional structure of FIG. 12, mention may be made of a cross sectional structure 50 of FIG. 13. FIG. 13 shows one example of the cross sectional structure of the cover glass 41 in FIG. 12, the adhesion layer 44 in contact with the cover glass 41, and the touch panel 42. The arrow in FIG. 13 indicates the direction of viewing from the surface side. As shown in FIG. 13, the color filter 4 corresponding to the first transparent substrate is provided with a first transparent electrode 52 arranged in the X direction, and a second transparent electrode 53 arranged in the Y direction. The detection of the coordinates is performed based on a change in electrostatic capacitance between the mutual transparent electrodes 52 and 53. The first transparent electrode 52A and the second transparent electrode 53 are separated from each other by an insulation layer 54 so as to prevent the contact therebetween. In FIG. 13, the first bridge electrode 52B ensures an electric connection between the first transparent electrodes 52A. The adhesion layer 44 is a layer for bonding the cover glass 41 of the second transparent substrate, and respective transparent electrodes, the bridge electrodes, and the like. The adhesion layer is a transparent adhesion layer such as OCA or OCR, and an acrylic adhesion material is used.

As the first bridge electrode 52B in FIG. 13, the electrode of the present invention can be preferably used. Below, a preferred embodiment of the electrode of the present invention will be described in details while showing the structures of FIGS. 14, 15, and 16 as preferable examples of the cross sectional structure along A2-A2 of FIG. 13.

Figure 14:
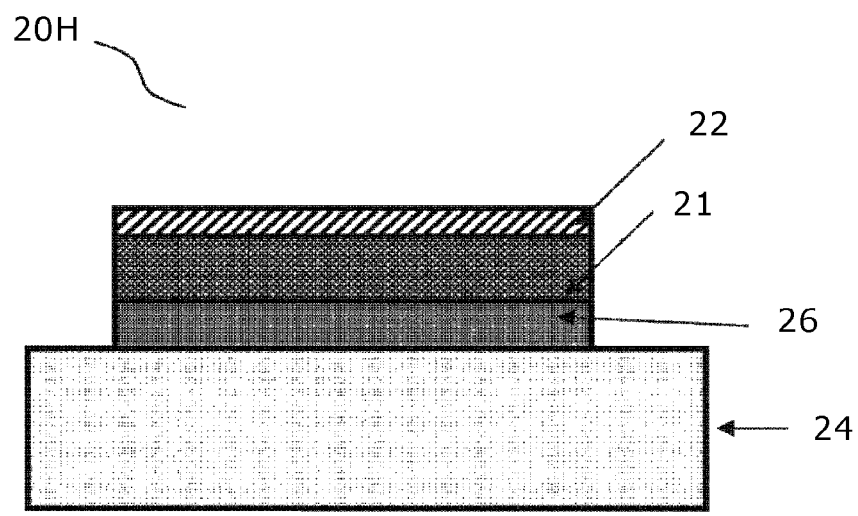
FIG. 14 is a schematic cross sectional view showing a still other example of structure of the electrode of the present invention, namely, an electrode in accordance with Embodiment 3A.

Embodiment 3A: Electrode Formed of Two-Layer Structure of First Layer and Second Layer FIG. 14 is a view showing another example of structure of the electrode of the present invention. In the electrode structure 20H of FIG. 14, on the transparent substrate 24, at least a transparent electrode 26 forming the electrostatic capacitance, a first layer 21 formed of an Al film or an Al alloy film, and a second layer 22 formed of a partially nitrided Al alloy are formed.

Figure 15:
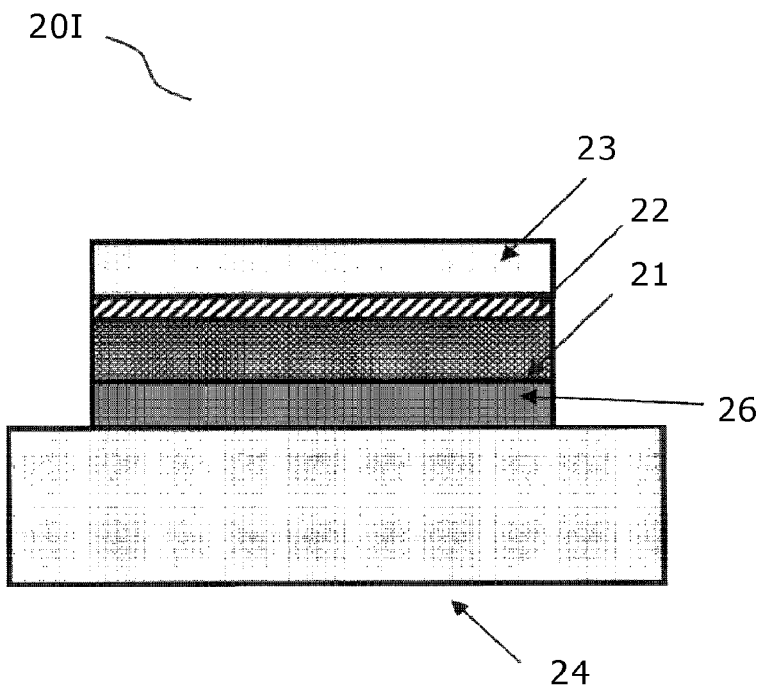
FIG. 15 is a schematic cross sectional view showing a still other example of structure of the electrode of the present invention, namely, an electrode in accordance with Embodiment 3B.

Embodiment 3B: Electrode of Three-Layer Structure Including First Layer, Second Layer, and Third Layer FIG. 15 is a view showing another example of structure of the electrode of the present invention. In the electrode structure 20I of FIG. 15, on the transparent substrate 24, at least a transparent electrode 26, a first layer 21 formed of an Al film or an Al alloy film, a second layer 22 formed of a partially nitrided Al alloy, and a third layer formed of a transparent conductive film 23 are formed. Incidentally, in the lamination structure, the order of the second layer 22 and the third layer 23 can be reversed.

Figure 16:
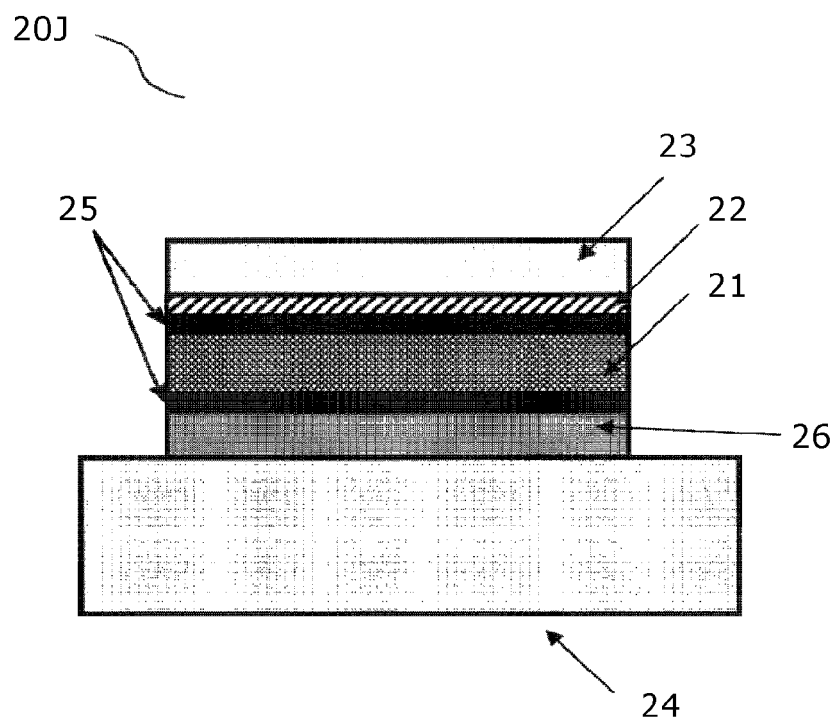
FIG. 16 is a schematic cross sectional view showing a still other example of structure of the electrode of the present invention, namely, an electrode in accordance with Embodiment 3C.

Embodiment 3C: Electrode of Five-Layer Structure of First Layer, Second Layer, Third Layer, and Mo Films FIG. 16 is a view showing another example of structure of the electrode of the present invention. The electrode structure 20J of FIG. 16 is a five-layer structure in which the Mo films 25 are stacked on and under the Al/Al alloy film forming the first layer 21 in the electrode structure 20I of FIG. 15 described above. The effects of the Mo films 25 are as described by reference to FIG. 6. In FIG. 16, the Mo films 25 are stacked both on and under the first layer 21. However, it is also acceptable that the Mo film 25 is formed either on or under the first layer 21.

Incidentally, each lamination structure of the electrode shown in FIGS. 14, 15, and 16 shows an example in which a transparent electrode 26 is interposed between the transparent substrate 24 and the electrode of the present invention. However, the lamination structure is not limited to this, and also includes, for example, the case where an insulation layer, an adhesion layer, or the like is interposed in place of the transparent electrode 26, or together with the transparent electrode 26, and the case where the transparent substrate and the electrode of the present invention are in direct contact with each other.

Embodiment 4: Cross Sectional Structure Example-2 in Input Device Example-2

Figure 17:
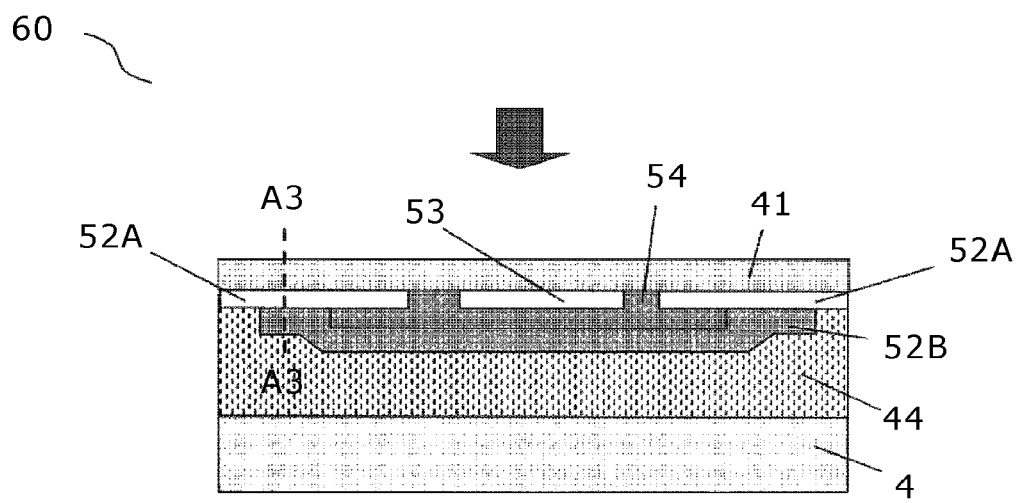
FIG. 17 is a schematic cross sectional view showing another example of the cross sectional structure of FIG. 12.

As another example of the cross sectional structure of FIG. 12, mention may be made of a cross sectional structure 60 of FIG. 17. In FIG. 17, the same parts as those in FIG. 12 are indicated with the same reference numerals and signs. In the cross sectional structure 60 of FIG. 17, transparent electrodes 52A and 53, an insulation layer 54, and a metal electrode as a first bridge electrode 52B are provided on the back surface side of a second transparent substrate, namely, a cover glass 41. The present embodiment is different in this point from the Embodiment 3. The arrow in FIG. 13 indicates the direction of viewing from the surface side. As shown in FIG. 17, the adhesion layer 44 is provided as a layer for bonding the color filter substrate of the first transparent substrate and the first and second transparent electrodes 52A and 53 and the first bridge electrode 52B opposed thereto.

As the first bridge electrode 52B in FIG. 17, the electrode of the present invention can be preferably used. Below, a preferred embodiment of the electrode of the present invention will be described in details while showing the structures of FIGS. 18, 19, and 20 as a preferable example of the cross sectional structure along A3-A3 of FIG. 17.

Figure 18:
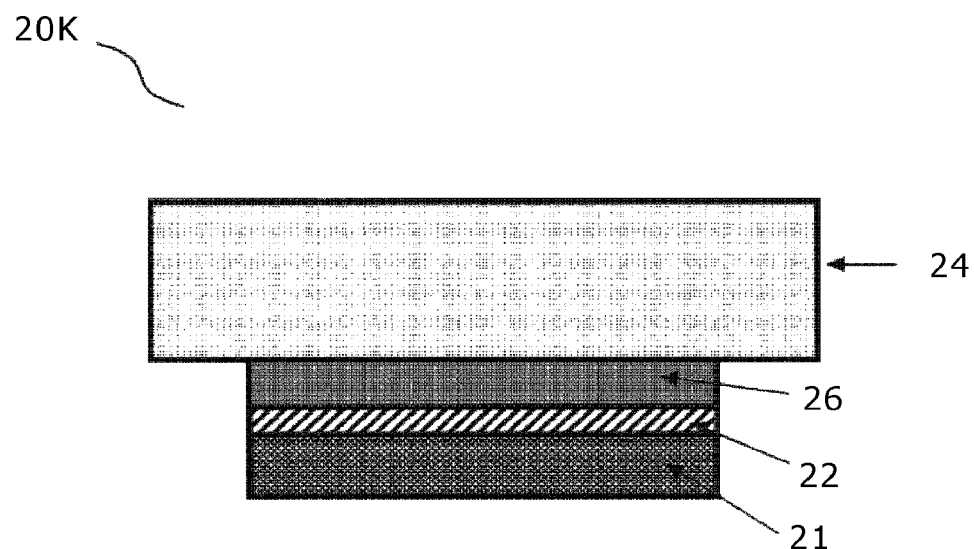
FIG. 18 is a schematic cross sectional view showing a still other example of structure of the electrode of the present invention, namely, an electrode in accordance with Embodiment 4A.

Embodiment 4A: Electrode Formed of Two-Layer Structure of First Layer and Second Layer FIG. 18 is a view showing another example of structure of the electrode of the present invention. In the electrode structure 20K of FIG. 18, on the transparent substrate 24, at least a transparent electrode 26 forming the electrostatic capacitance, a second layer 22 formed of a partially nitrided Al alloy, and a first layer 21 formed of an Al film or an Al alloy film are formed. In the present form, the second layer 22 of an optical adjustment layer is provided on the viewed side, namely, at a position closer to the transparent substrate so as to prevent the Al/Al alloy film layer of the first layer 21 from being visually recognized.

Figure 19:
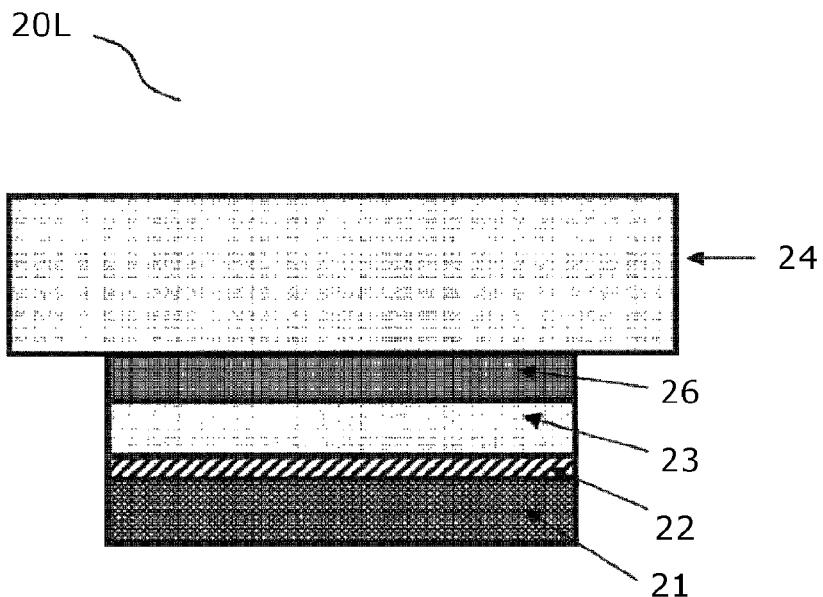
FIG. 19 is a schematic cross sectional view showing a still other example of structure of the electrode of the present invention, namely, an electrode in accordance with Embodiment 4B.

Embodiment 4B: Electrode of Three-Layer Structure Including First Layer, Second Layer, and Third Layer FIG. 19 is a view showing another example of structure of the electrode of the present invention. In the electrode structure 20L of FIG. 19, at least a transparent electrode 26 forming an electrostatic capacitance, a third layer 23 formed of a transparent conductive film, a second layer 22 formed of a partially nitrided Al alloy, and a first layer 21 formed of an Al film or an Al alloy film are formed at the transparent substrate 24. In the present form, the second layer 22 and the third layer 23 of optical adjustment layers are provided on the viewed side, namely, at a position closer to the transparent substrate 24 so as to prevent the Al alloy film layer of the first layer 21 from being visually recognized. Incidentally, in the lamination structure, the order of the second layer 22 and the third layer 23 may be reversed.

Figure 20:
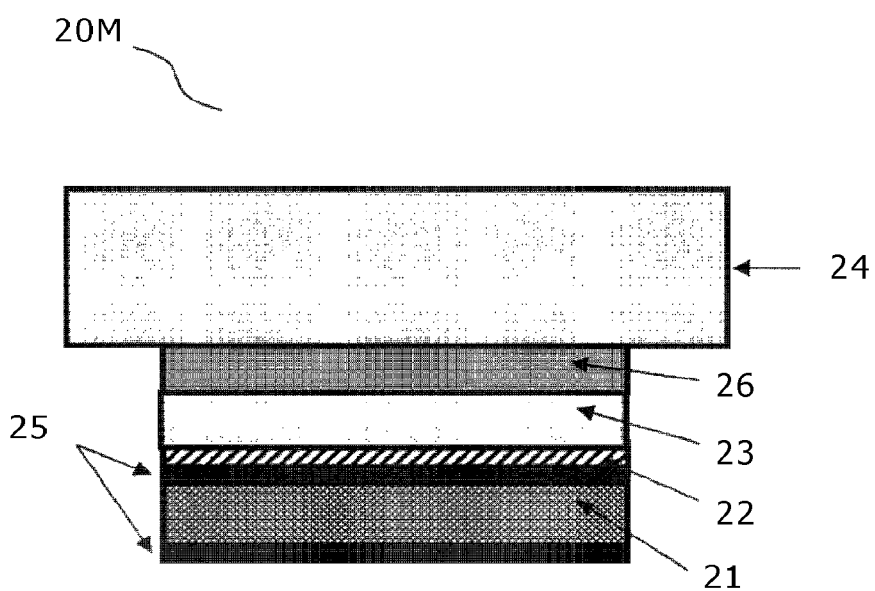
FIG. 20 is a schematic cross sectional view showing a still other example of structure of the electrode of the present invention, namely, an electrode in accordance with Embodiment 4C.

Embodiment 4C: Electrode of Five-Layer Structure of First Layer, Second Layer, Third Layer, and Mo Films FIG. 20 is a view showing another example of structure of the electrode of the present invention. The electrode structure 20M of FIG. 20 is a five-layer structure in which the Mo films 25 are stacked on and under the Al/Al alloy film forming the first layer 21 in the electrode structure 20L of FIG. 19 described above. The effects of the Mo films 25 are as described by reference to FIG. 6. In FIG. 20, the Mo films 25 are stacked both on and under the first layer 21. However, it is also acceptable that the Mo film 25 is formed either on or under the first layer 21.

Up to this point, the electrode of the present invention was described in details.

In the present description, the "electrodes" also include a wire before processing into an electrode shape. As described above, the electrode of the present invention combines a low sheet resistance and a low reflectivity, and hence is applicable not only to an electrode for use in the input region of the input device but also to the wiring region at the panel peripheral part by extension of the electrode.

In Embodiment 1 and Embodiment 2 described above, there has been shown an example to be applied to a so-called on-cell type structure in which the detecting electrode and the driving electrode are formed of metal electrodes, and an input device is formed between a color filter and a cover glass, and the configuration has been described in details. However, the present invention is not limited thereto.

Whereas, in Embodiment 3 and Embodiment 4 described above, there has been shown an example to be applied to the following so-called out-cell type structure: the input device in which the detecting electrode and the driving electrode are set as transparent electrodes and the bridge electrode between the transparent electrodes is formed of a metal electrode is formed separately from the liquid crystal cell; and the configuration has been described in details. However, the present invention is not limited thereto.

The electrode of the present invention is also applicable to, for example, a so-called in-cell type structure in which the electrode of the input device is mounted in a liquid crystal display device, for example, between the TFT substrate and the color filter substrate. Thus, it is naturally understood that the present invention is not limited to the Embodiments, and may be variously changed within the scope not departing from the gist thereof.

Further, the input devices to which the electrode of the present invention is applied include both an input device in which the display device includes an input means as with a touch panel or the like; and an input device not having a display device such as a touch panel. Specifically, the electrodes of the present invention can also be used for the electrodes of input devices for operating devices by pushing the display on the screen in which the various display devices and position input means are combined; and an input device for operating the display device separately provided corresponding to the input position on the position input means. The input devices may each include, in addition to the electrode of the present invention, a transparent substrate, a transparent electrode, an adhesion layer, an insulation film, and the like as exemplified above. As these, there can be adopted those used in a touch panel, a touch pad, and the like.

Then, a method for producing the electrode of the present invention will be described. Below, a production method will be described by taking the Embodiment 1A as an example.

For producing an electrode having the lamination structure, from the viewpoints of thinning, uniformization of the alloy components in the film, and further, ease of control of the additive element amount, and the like, deposition is preferably performed by a sputtering method using a sputtering target.

Particularly, for depositing the Al—X alloy-N layer forming the second layer featuring the electrode of the present invention, for example, as also shown later, mention may be made of a co-sputtering method of an Al sputtering target and a sputtering target including desired X group elements; a method for mounting a metal chip including a desired element on an Al sputtering target for deposition, and the like. Alternatively, an alloy target may be used so as to achieve a desired composition.

In view of the viewpoints of the productivity, the film quality control, and the like, it is preferable to adopt a reactive sputtering method including a nitrogen gas. Namely, a method for producing the electrode in accordance with the present invention is characterized in that the Al—X alloy-N layer forming the second layer is deposited by a reactive sputtering method including a nitrogen gas.

The conditions for the reactive sputtering method for depositing the second layer may be properly controlled according to, for example, the kind of the Al alloy to be used, the nitrogen atom ratio to be introduced, or the like. However, the conditions are preferably controlled as follows.

Substrate temperature: room temperature to 400° C.
Atmosphere gas: nitrogen gas, Ar gas
Nitrogen gas flow rate during deposition: 5 to 50% of Ar gas
Sputtering power: 100 to 500 W
Ultimate vacuum: $1 \times 10^{-6}$ Torr or less As the sputtering target to be used, a sputtering target of Al or Al alloy corresponding to the second layer to be deposited may be used. When the Al—X alloy-N layer is deposited, as the sputtering target to be used, a plurality of sputtering targets including metal elements forming the second layer to be deposited may be used. The shape of the sputtering target has no particular restriction. Those processed into a given shape such as an angular plate shape, a circular plate shape, a doughnut plate shape, or a cylindrical shape can be used according to the shape or the structure of the sputtering target.

However, the deposition method of the second layer is not limited to the methods described above. For example, using a sputtering target of an Al nitride or an Al alloy nitride previously subjected to a nitriding treatment, sputtering may be performed in an atmosphere including only a noble gas element such as Ar, namely, without introduction of a nitrogen gas, thereby to deposit a desired second layer. Alternatively, using an alloy sputtering target with the same composition as that of the desired Al alloy, and using a nitrogen gas as an atmosphere gas, sputtering may be performed, thereby to deposit a desired second layer. Still alternatively, using two or more pure metal targets or alloy targets having different compositions in place of the alloy sputtering target, these may be discharged at the same Lime, thereby to deposit a second layer. As the method for controlling the nitrogen atom ratio in the second layer, for example, mention may be made of the change in kind or addition amount of the X group elements, the adjustment of the flow rate of a nitrogen gas in a process gases during deposition, or the adjustment of the content of nitrogen atoms in the Al alloy nitride target.

The present invention is characterized by the deposition method of the second layer. For the deposition methods of other respective layers, methods commonly used in the technical field of the present invention can be appropriately adopted.

For the foregoing production method, the production method of the electrode in accordance with the Embodiment 1A was shown as an example. However, also in other embodiments, production can be achieved by reversing the order of formation of the first layer and the second layer. Whereas, the transparent conductive film of the third layer, the Mo films to be further stacked, the oxide layer forming the transparent electrode, and the like can be formed by known methods.

The present application claims the benefit of a priority based on Japanese Unexamined Patent Application Publication No. 2013-234388 filed on Nov. 12, 2013, and Japanese Unexamined Patent Application Publication No. 2014-113283 filed on May 30, 2014. The entire contents of Japanese Unexamined Patent Application Publication No. 2013-234388 filed on Nov. 12, 2013, and the entire contents of Japanese Unexamined Patent Application Publication No. 2014-113283 filed on May 30, 2014 are herein incorporated by reference.

EXAMPLES

Below, the present invention will be described more specifically by way of examples. However, the present invention is not limited by the following examples, and may also be changed and practiced within the scope applicable to the gist described previously and layer. All of these are included in the technical range of the present invention. Namely, below, examples in accordance with Embodiment 1 and Embodiment 2 will be shown. However, also when the electrode of the present invention is applied to other embodiments, the same effects are exerted.

Example 1

In the present example, there was formed a sample of a structure in which a first layer, a second layer, and a third layer were stacked sequentially from the transparent substrate side. Using the Al—N layer or the Al—X alloy-N layer described in Table 1 as the second layer, samples of the lamination films shown in Table 2 or Table 3 were deposited. The reflectivity and the sheet resistance were measured, and the wet etching processability by a phosphoric nitric acetic acid based etchant was evaluated. Below, the methods for depositing the first layer, the second layer, and the third layer sequentially from the transparent substrate side will be described sequentially.

(1) Formation of Sample
(1-1) Deposition of First Layer

First, a non-alkali glass sheet (0.7 mm in thickness, 4 inches in diameter) was used as the transparent substrate. On the surface, each first layer shown in Table 2 or Table 3 was deposited by a DC magnetron sputtering method. For deposition, the atmosphere in a chamber was once adjusted to an ultimate vacuum: $3 \times 10^{-6}$ Torr before deposition. Then, using a disc-shaped sputtering target with a diameter of 4 inches having the same composition as that of the metal film, sputtering was performed under the following conditions.
(Sputtering Conditions)
  Ar gas pressure: 2 mTorr
  Ar gas flow rate: 30 sccm
  Sputtering power: 250 W
  Substrate temperature: room temperature
(1-2) Deposition of Second Layer Second Layers are Nos. 1 to 11 of Table 1

Using an alloy target with a desired composition so that the second layer has each composition described in Table 1, deposition by a reactive sputtering method with a nitrogen gas was performed under the following conditions. Alternatively, deposition was performed by a co-sputtering method in which reactive sputtering with a nitrogen gas was performed using a pure Al target and a target formed of X group elements in place of the alloy target. As a result, an Al—N layer, or as an Al—X alloy-N layer, an Al—Ti alloy-N layer, an Al—Ta alloy-N layer, an Al—Mn alloy-N layer, or an Al—Cu alloy-N layer were formed. In the present Example, in Table 2, the Ar gas flow rate during the second layer deposition was set constant, and the nitrogen gas flow rate was set as described below. Whereas, in Table 3, as described below, the Ar gas flow rate and the nitrogen gas flow rate during the second layer deposition were set constant. In the column of "Deposition method" of Table 1, the case where deposition is performed using the alloy target is indicated as "1 target", and the case where deposition is performed by the co-sputtering method is indicated as "Co-sputtering".
(Reactive Sputtering Conditions)
  Gas pressure: 2 mTorr
  Ar gas flow rate: 10 sccm
  Nitrogen gas flow rate: 3 sccm for Nos. 1 to 22 of Table 2, and 5 sccm for Table 3
  Sputtering power: 500 W
  Substrate temperature: room temperature
[Second Layers are Nos. A to C of Table 1]
Using pure Al and Al-20 at % Ti targets, a thin film was formed by a co-sputtering method by changing the deposition power ratio so as to implement each composition of Table 1. Other sputtering conditions were as follows.
  Gas pressure: 2 mTorr
  Ar gas flow rate: 14 sccm
  Nitrogen gas flow rate: 7 sccm
  Sputtering power: 500 W
  Substrate temperature: room temperature
[Second Layers are Nos. D to F of Table 1]
Using pure Al and Al-30 at % Ta targets, a thin film was formed by a co-sputtering method by changing the deposition power ratio so as to implement each composition of Table 1. Other sputtering conditions were as follows.

Gas pressure: 2 mTorr
Ar gas flow rate: 14 sccm
Nitrogen gas flow rate: 7 sccm
Sputtering power: 500 W
Substrate temperature: room temperature
[Second layers are Nos. G to M of Table 1]

Using an Al-17 at % Cu alloy target, deposition was performed under the conditions of gas pressure: 2 mTorr, sputtering power: 500 W, the ratio of the flow rate of a nitrogen gas to the total flow rate of an Ar gas and a nitrogen gas: 9% to 44%, and substrate temperature: room temperature.

[Second Layers are Nos. N to R of Table 1]

Using an Al-12 at % Cu alloy target, deposition was performed under the conditions of gas pressure: 2 mTorr, sputtering power: 500 W, the ratio of the flow rate of a nitrogen gas to the total flow rate of an Ar gas and a nitrogen gas: 9% to 44%, and substrate temperature: room temperature.

[Second Layers are Nos. S to X of Table 1]

Using an Al-7 at % Cu alloy target, deposition was performed under the conditions of gas pressure: 2 mTorr, sputtering power: 500 W, the ratio of the flow rate of a nitrogen gas to the total flow rate of an Ar gas and a nitrogen gas: 9% to 44%, and substrate temperature: room temperature.

Incidentally, for the measurements of the optical constant and the electrical resistivity of the second layer described layer, and the analysis of the nitrogen atom ratio of the second layer, as a sample, the one obtained by depositing only the second layer on a non-alkali glass sheet (0.7 mm in thickness, and 4 inches in diameter) under the conditions described above was used. Further, for the measurement of the electrical resistivity of the first layer, the one obtained by depositing only the first layer under the conditions described above was also prepared.

(1-3) Deposition of Third Layer

In the foregoing manner, the Al—N layer or the Al—X alloy-N layer of the second layer was deposited. Then, subsequently, on the surface, an IZO film was deposited as a transparent conductive film under the following sputtering conditions by a DC magnetron sputtering method. For deposition of the transparent conductive film, the atmosphere in a chamber was once adjusted to an ultimate vacuum: $3 \times 10^{-6}$ Torr before deposition. Then, a disc-shaped IZO sputtering target with a diameter of 4 inches having the same composition as that of the transparent conductive film was used.

(Sputtering Conditions)

Gas pressure: 2 mTorr
Ar gas flow rate: 18 sccm
$O_2$ gas flow rate: 1 sccm
Sputtering power: 250 W
Substrate temperature: room temperature The reflectivity, the sheet resistance, and the wet etching processability of the lamination film thus obtained were measured in the following manner. Further, the nitrogen atom ratio, the refractive index and the extinction coefficient as optical constants, and the electrical resistivity of the second layer were measured in the following manner.

(2) Analysis of Nitrogen Atom Ratio of Second Layer

In order to examine the partial nitrided state of the second layer shown in Table 1, using a PHI650 scanning Auger electron spectrometer manufactured by Perkin Elmer Co., Ltd., an electron beam with an energy: 3 keV, and a current: about 50 nA was applied at an angle of 75° to the surface of the second layer, thereby to measure the AES (Auger Electron Spectroscopy) spectrum (also referred to as Auger spectrum). For the depth direction of the second layer, the measurements were performed in the same manner under the foregoing conditions while performing etching by ion sputtering of $Ar^+$. The content ratio of nitrogen atoms when the total sum of Al atoms, X group element atoms, and nitrogen atoms measured by the foregoing method was the denominator was determined as the nitrogen atom ratio in the second layer. The results are shown in the column of "Nitrogen atom ratio" in Table 1.

(3) Measurements of Optical Constants (Refractive Index and Extinction Coefficient) of Second Layer For the single film of the second layer obtained by the foregoing method, using a spectroscopic ellipsometer M-2000U manufactured by J. A. Woollam. Japan, the refractive index and the extinction coefficient were measured as the optical constants. Then, in the present Example, the case was regarded as acceptable where all the extinction coefficients were 0.15 or more at any wavelength region of $\lambda=450$ nm, 550 nm, and 650 nm, and all the refractive indices were 1.0 or more at any wavelength region of $\lambda=450$ nm, 550 nm, and 650 nm.

(4) Measurement of Electrical Resistivity of Second Layer

The electrical resistivity was measured by a four-terminal method. Incidentally, in Table 1, for example, "4.22E-03" of No. 1 means $4.22 \times 10^{-3}$.

(5) Measurement of Electrical Resistivity of First Layer

The electrical resistivity was measured by a four-terminal method. In the present example, the sample with an electrical resistivity of the first layer of 20 μΩ·cm or less was evaluated as acceptable. The results are shown in Table 4. Table 4 indicates that all of the Al alloy films used in the present example each have an electrical resistivity of 20 μΩ·cm or less.

(6) Measurement of Resistivity of Lamination Film

For the resistivity of each lamination film obtained by the foregoing method, using a V-570 spectrophotometer manufactured by JASCO Corporation, the absolute resistivities at 450 nm, 550 nm, and 650 nm were measured and determined. The sample whose reflectivities at 450 nm, 550 nm, and 650 nm were all 50% or less was evaluated as acceptable, namely, as being excellent in low reflectivity. The sample with even one reflectivity of more than 50% was evaluated as unacceptable.

(7) Measurement of Shoot Resistance of Lamination Film

The sheet resistance was measured by a four-terminal method. In the present example, a sample with a sheet resistance of 2.0 Ω/or less was evaluated as acceptable.

Figure 21:
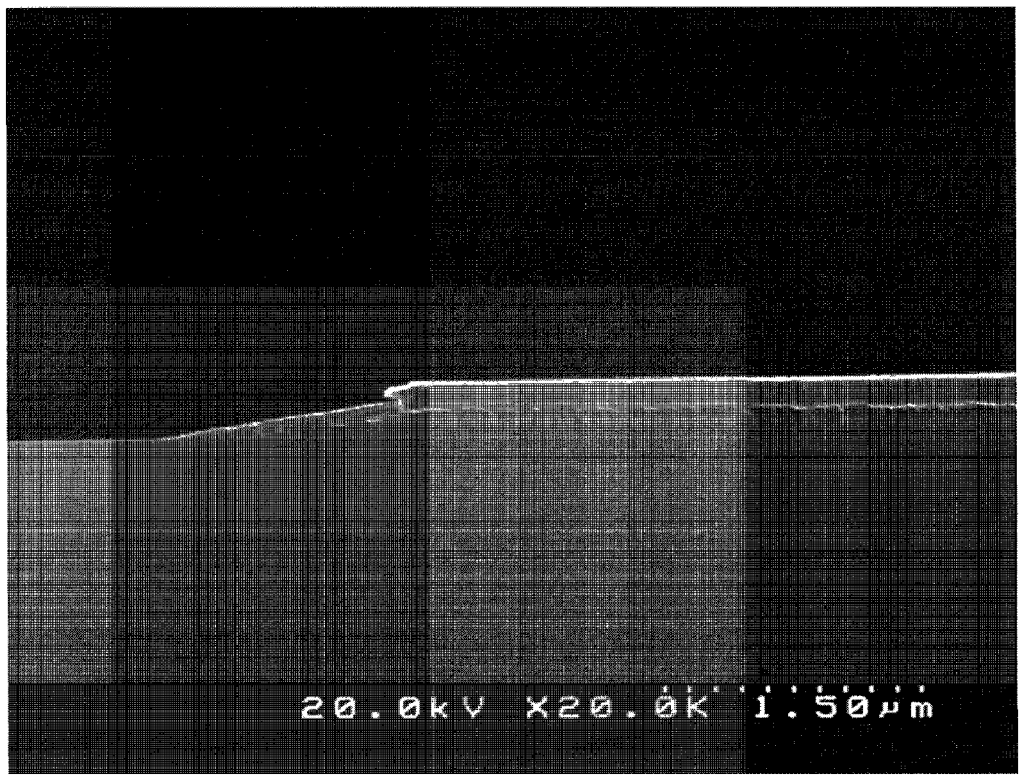
FIG. 21 is a view showing the cross sectional shape when the lamination film of No. 4 of Table 2 (the inventive example) is patterned with a phosphoric nitric acetic acid based etchant.
Figure 22:
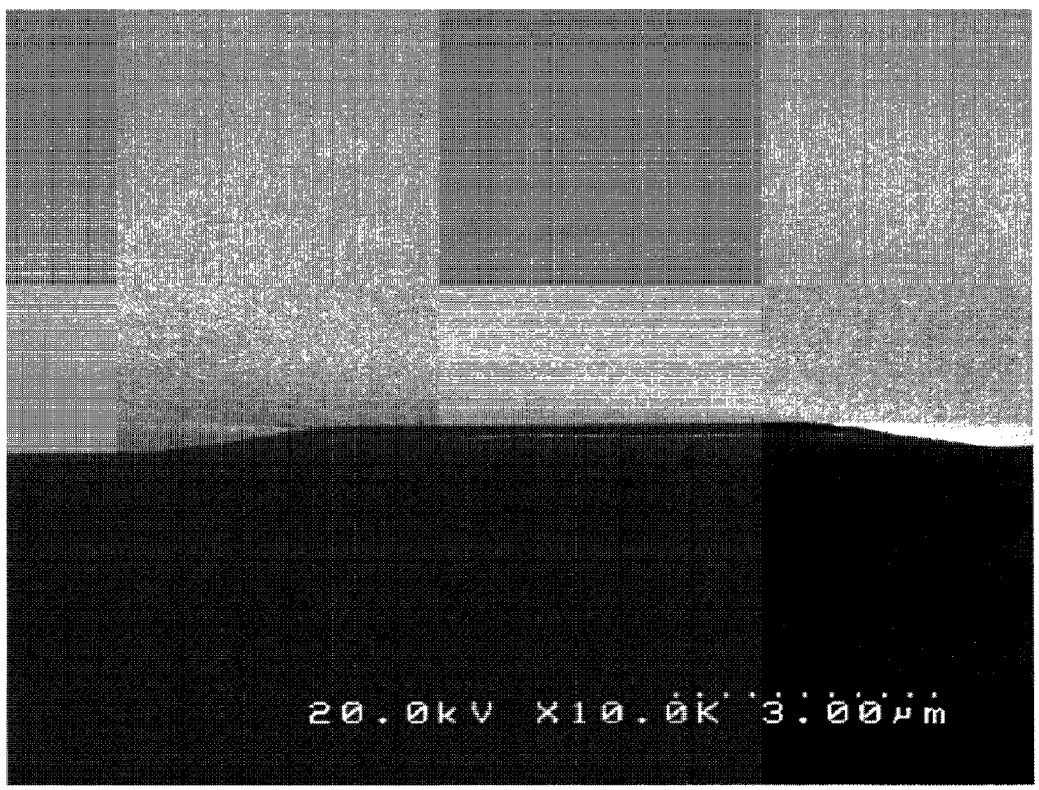
FIG. 22 is a view showing the cross sectional shape when the lamination film of No. 16 of Table 2 (the inventive example) is patterned with a phosphoric nitric acetic acid based etchant.

(8) Evaluation of Wet Etching Processability by Phosphoric Nitric Acetic Acid Based Etchant of Lamination Film 375 mL of phosphoric acid, 15.7 mL of nitric acid, 72.9 mL of acetic acid, and 36.3 mL of water were mixed to prepare a phosphoric nitric acetic acid based etchant. Using the phosphoric nitric acetic acid based etchant thus obtained, each lamination film described above was subjected to etching processing. Then, those which have resulted in a forward tapered shape as shown in FIGS. 21 and 22 were evaluated as OK, namely, as being excellent in wet etching processability, and those which have not resulted in a forward tapered shape were evaluated as NG.

The results are shown in Tables 1 to 4. At the rightmost column of Table 1, an "Evaluation" column is provided. The samples whose refractive indices and extinction coefficients were all acceptable were evaluated as "OK", and the samples with any one unacceptable optical constant were evaluated as "NG".

TABLE 1

| No. | Second layer | Deposition method | Nitrogen atom ratio at % | Refractive index 450 nm | Refractive index 550 nm | Refractive index 650 nm | Extinction coefficient 450 nm | Extinction coefficient 550 nm | Extinction coefficient 650 nm | Electrical resistivity Ω·cm | Evaluation |
|---|---|---|---|---|---|---|---|---|---|---|---|
| A | Al-1at % Ti—N | Co-sputtering | 59 | 2.12 | 2.08 | 2.06 | 0.08 | 0.06 | 0.04 | 5.50E+07 | NG |
| B | Al-2at % Ti—N | Co-sputtering | 53 | 2.34 | 2.35 | 2.35 | 0.38 | 0.34 | 0.30 | 3.80E+01 | OK |
| C | Al-9at % Ti—N | Co-sputtering | 48 | 2.30 | 2.43 | 2.51 | 0.84 | 0.78 | 0.72 | 3.80E−03 | OK |
| D | Al-1.5at % Ta—N | Co-sputtering | 58 | 2.12 | 2.09 | 2.08 | 0.03 | 0.04 | 0.04 | 6.10E+08 | NG |
| E | Al-7at % Ta—N | Co-sputtering | 50 | 2.06 | 2.03 | 2.01 | 0.40 | 0.52 | 0.45 | 5.70E+02 | OK |
| F | Al-29at % Ta—N | Co-sputtering | 39 | 2.33 | 2.44 | 2.49 | 1.19 | 1.18 | 1.22 | 2.30E−04 | OK |
| 1 | Al-77at % Mn—N | 1 target | 44 | 2.61 | 2.76 | 2.87 | 1.18 | 1.11 | 1.05 | 4.22E−03 | OK |
| 2 | Al-55at % Mn—N | 1 target | 48 | 2.44 | 2.62 | 2.75 | 1.10 | 1.03 | 0.96 | 2.70E−02 | OK |
| 3 | Al-50at % Mn—N | 1 target | 53 | 2.41 | 2.60 | 2.70 | 1.10 | 1.01 | 0.90 | 1.30E+01 | OK |
| 4 | Al-43at % Mn—N | 1 target | 55 | 2.39 | 2.59 | 2.70 | 1.09 | 0.98 | 0.87 | 1.00E+02 | OK |
| 5 | Al-36at % Mn—N | 1 target | 57 | 2.38 | 2.60 | 2.71 | 1.09 | 0.98 | 0.86 | 1.20E+03 | OK |
| 6 | Al-27at % Cu—N | 1 target | 38 | 1.61 | 2.11 | 2.52 | 2.15 | 2.30 | 2.36 | 3.54E−04 | OK |
| 7 | Al-17at % Cu—N | Co-sputtering | 36 | 2.55 | 2.68 | 2.77 | 1.06 | 0.97 | 0.91 | 6.38E−04 | OK |
| G | Al-17at % Cu—N | 1 target | 14 | 1.25 | 1.71 | 2.21 | 4.18 | 4.93 | 5.59 | 5.49E−05 | OK |
| H | Al-17at % Cu—N | 1 target | 22 | 1.40 | 1.88 | 2.40 | 3.62 | 4.23 | 4.75 | 9.71E−05 | OK |
| I | Al-17at % Cu—N | 1 target | 36 | 1.61 | 2.09 | 2.58 | 3.18 | 3.66 | 4.03 | 1.83E−04 | OK |
| J | Al-17at % Cu—N | 1 target | 49 | 2.31 | 2.63 | 2.87 | 1.76 | 1.80 | 1.78 | 4.66E−03 | OK |
| K | Al-17at % Cu—N | 1 target | 51.3 | 2.26 | 2.71 | 2.72 | 1.38 | 1.40 | 1.48 | 3.20E+00 | OK |
| L | Al-17at % Cu—N | 1 target | 54.4 | 2.11 | 2.48 | 2.60 | 1.02 | 1.20 | 1.32 | 2.50E+03 | OK |
| M | Al-17at % Cu—N | 1 target | 59 | 2.36 | 2.30 | 2.27 | 0.13 | 0.07 | 0.05 | 1.32E+07 | NG |
| 8 | Al-12at % Cu—N | Co-sputtering | 38 | 2.51 | 2.56 | 2.59 | 0.66 | 0.57 | 0.51 | 9.37E−04 | OK |
| N | Al-12at % Cu—N | 1 target | 16 | 1.09 | 1.49 | 1.90 | 4.16 | 4.92 | 5.60 | 4.22E−05 | OK |
| O | Al-12at % Cu—N | 1 target | 24 | 1.26 | 1.66 | 2.09 | 3.73 | 4.38 | 4.98 | 7.11E−05 | OK |
| P | Al-12at % Cu—N | 1 target | 38 | 1.59 | 2.03 | 2.49 | 3.26 | 3.76 | 4.18 | 1.49E−04 | OK |
| Q | Al-12at % Cu—N | 1 target | 56 | 2.42 | 2.65 | 2.81 | 1.35 | 1.30 | 1.23 | 1.48E−01 | OK |
| R | Al-12at % Cu—N | 1 target | 59 | 2.23 | 2.16 | 2.13 | 0.05 | 0.03 | 0.02 | 1.00E+13 | NG |
| 9 | Al-11at % Cu—N | Co-sputtering | 40 | 2.48 | 2.52 | 2.56 | 0.61 | 0.53 | 0.50 | 2.83E−02 | OK |
| 10 | Al-7at % Cu—N | Co-sputtering | 58 | 2.37 | 2.37 | 2.36 | 0.30 | 0.23 | 0.18 | 4.21E+01 | OK |
| S | Al-7at % Cu—N | 1 target | 16 | 1.18 | 1.45 | 2.01 | 4.25 | 4.92 | 5.61 | 3.20E−05 | OK |
| T | Al-7at % Cu—N | 1 target | 26 | 1.36 | 1.66 | 2.32 | 3.67 | 4.38 | 4.82 | 7.30E−05 | OK |
| U | Al-7at % Cu—N | 1 target | 39 | 1.62 | 2.05 | 2.51 | 3.21 | 3.62 | 4.20 | 9.75E−05 | OK |
| V | Al-7at % Cu—N | 1 target | 56 | 2.40 | 2.72 | 2.97 | 1.78 | 1.79 | 1.75 | 2.11E−03 | OK |
| W | Al-7at % Cu—N | 1 target | 58 | 2.31 | 2.52 | 2.51 | 1.38 | 1.32 | 1.38 | 4.69E+02 | OK |
| X | Al-7at % Cu—N | 1 target | 59 | 2.41 | 2.32 | 2.32 | 0.02 | 0.07 | 0.02 | 3.80E+13 | NG |
| 11 | AlN | 1 target | 50 | 2.10 | 2.08 | 2.06 | 0.00 | 0.02 | 0.02 | 1.00E+09 | NG |

TABLE 2

| No. | First layer | Second layer | Table 1 No. | Third layer | First layer thickness (nm) | Second layer thickness (nm) | Third layer thickness (nm) | Reflectivity 450 nm (%) | Reflectivity 550 nm (%) | Reflectivity 650 nm (%) | Sheet resistance Ω/□ | Wet etching processability |
|---|---|---|---|---|---|---|---|---|---|---|---|---|
| 1 | Al-1.0at % Cu-1.0at % Mn | Al-77at % Mn—N | 1 | IZO | 40 | 50 | 50 | 7.8 | 8.6 | 10.0 | 2.1 | OK |
| 2 | Al-1.0at % Cu-1.0at % Mn | Al-77at % Mn—N | 1 | IZO | 50 | 50 | 50 | 7.7 | 8.7 | 10.1 | 1.8 | OK |
| 3 | Al-1.0at % Cu-1.0at % Mn | Al-77at % Mn—N | 1 | IZO | 140 | 50 | 50 | 11.4 | 1.9 | 1.2 | 0.9 | OK |
| 4 | Al-1.0at % Cu-1.0at % Mn | Al-77at % Mn—N | 1 | IZO | 250 | 50 | 50 | 9.6 | 9.4 | 8.1 | 0.5 | OK |
| 5 | Al-1.0at % Cu-1.0at % Mn | Al-55at % Mn—N | 2 | IZO | 250 | 50 | 50 | 10.2 | 11.5 | 7.6 | 0.5 | OK |
| 6 | Al-1.0at % Cu-1.0at % Mn | Al-43at % Mn—N | 4 | IZO | 250 | 200 | 50 | 12.8 | 34.6 | 40.8 | 0.5 | OK |
| 7 | Al-1.0at % Cu-1.0at % Mn | Al-36at % Mn—N | 5 | IZO | 250 | 200 | 50 | 2.0 | 53.7 | 38.9 | 0.6 | OK |
| 8 | Al-1.0at % Cu-1.0at % Mn | Al-36at % Mn—N | 5 | IZO | 250 | 400 | 50 | 11.2 | 4.5 | 49.9 | 0.6 | OK |
| 9 | Al-1.0at % Cu-1.0at % Mn | Al-27at % Cu—N | 6 | IZO | 250 | 50 | 50 | 19.0 | 1.2 | 2.1 | 0.5 | OK |
| 10 | Al-1.0at % Cu-1.0at % Mn | Al-17at % Cu—N | 7 | IZO | 250 | 10 | 50 | 55.0 | 46.8 | 42.3 | 0.5 | OK |
| 11 | Al-1.0at % Cu-1.0at % Mn | Al-17at % Cu—N | 7 | IZO | 250 | 30 | 50 | 27.5 | 22.0 | 13.1 | 0.5 | OK |
| 12 | Al-1.0at % Cu-1.0at % Mn | Al-17at % Cu—N | 7 | IZO | 250 | 50 | 50 | 10.5 | 13.6 | 13.4 | 0.5 | OK |
| 13 | Al-1.0at % Cu-1.0at % Mn | Al-17at % Cu—N | 7 | IZO | 250 | 100 | 50 | 12.6 | 0.5 | 7.3 | 0.5 | OK |
| 14 | Al-1.0at % Cu-1.0at % Mn | Al-17at % Cu—N | 7 | IZO | 250 | 150 | 50 | 10.7 | 3.2 | 2.2 | 0.5 | OK |
| 15 | Al-1.0at % Cu-1.0at % Mn | Al-17at % Cu—N | 7 | IZO | 250 | 200 | 50 | 11.3 | 2.1 | 4.3 | 0.5 | OK |
| 16 | Al-1.0at % Cu-1.0at % Mn | Al-12at % Cu—N | 8 | IZO | 250 | 50 | 50 | 18.4 | 32.3 | 31.3 | 0.5 | OK |
| 17 | Al-1.0at % Cu-1.0at % Mn | Al-7at % Cu—N | 10 | IZO | 250 | 50 | 50 | 30.4 | 62.1 | 66.8 | 0.5 | NG |
| 18 | Al-1.0at % Cu-1.0at % Mn | Al-7at % Cu—N | 10 | IZO | 250 | 100 | 50 | 32.5 | 10.5 | 52.5 | 0.5 | NG |
| 19 | Al-1.0at % Cu-1.0at % Mn | Al-7at % Cu—N | 10 | IZO | 250 | 200 | 50 | 20.3 | 14.5 | 40.3 | 0.5 | OK |
| 20 | Al-1.0at % Cu-1.0at % Mn | AlN | 11 | IZO | 250 | 50 | 50 | 92.1 | 95.2 | 91.6 | 0.5 | OK |
| 21 | Ag | Al-12at % Cu—N | 8 | IZO | 250 | 50 | 50 | 4.8 | 22.3 | 29.9 | 0.1 | NG |
| 22 | Cu | Al-12at % Cu—N | 8 | IZO | 250 | 50 | 50 | 6.8 | 8.2 | 15.1 | 0.1 | NG |
| a | Al | Al-1at % Ti—N | A | IZO | 250 | 50 | 50 | 75.0 | 82.0 | 74.0 | 0.4 | NG |
| b | Al | Al-2at % Ti—N | B | IZO | 250 | 50 | 50 | 36.0 | 50.0 | 47.0 | 0.4 | OK |
| c | Al | Al-9at % Ti—N | C | IZO | 250 | 50 | 50 | 18.0 | 22.0 | 20.0 | 0.4 | OK |
| d | Al | Al-1.5at % Ta—N | D | IZO | 250 | 50 | 50 | 85.0 | 84.0 | 74.0 | 0.4 | NG |

TABLE 2-continued

| | Structure of lamination film | | | | | | | Reflectivity (%) | | | Sheet resistance Ω/□ | Wet etching processability |
|---|---|---|---|---|---|---|---|---|---|---|---|---|
| | Kind of each layer | | | | Film thickness of each layer (nm) | | | | | | | |
| No. | First layer | Second layer | Table 1 No. | Third layer | First layer | Second layer | Third layer | 450 nm | 550 nm | 650 nm | | |
| e | Al | Al-7at % Ta—N | E | IZO | 250 | 50 | 50 | 41.0 | 45.0 | 43.0 | 0.4 | OK |
| f | Al | Al-29at % Ta—N | F | IZO | 250 | 50 | 50 | 13.0 | 9.9 | 5.7 | 0.4 | OK |
| g | Al | Al-17at % Cu—N | G | IZO | 250 | 50 | 50 | 49.0 | 34.0 | 40.0 | 0.4 | OK |
| h | Al | Al-17at % Cu—N | H | IZO | 250 | 50 | 50 | 42.0 | 23.0 | 29.0 | 0.4 | OK |
| i | Al | Al-17at % Cu—N | L | IZO | 250 | 50 | 50 | 20.0 | 5.2 | 3.1 | 0.4 | OK |
| j | Al | Al-17at % Cu—N | M | IZO | 250 | 50 | 50 | 64.0 | 79.0 | 74.0 | 0.4 | NG |
| k | Al | Al-12at % Cu—N | N | IZO | 250 | 50 | 50 | 50.0 | 37.0 | 44.0 | 0.4 | OK |
| l | Al | Al-12at % Cu—N | O | IZO | 250 | 50 | 50 | 46.0 | 27.0 | 34.0 | 0.4 | OK |
| m | Al | Al-12at % Cu—N | Q | IZO | 250 | 50 | 50 | 11.0 | 5.6 | 5.8 | 0.4 | OK |
| n | Al | Al-12at % Cu—N | R | IZO | 250 | 50 | 50 | 80.0 | 85.0 | 77.0 | 0.4 | NG |
| o | Al | Al-7at % Cu—N | S | IZO | 250 | 50 | 50 | 50.0 | 36.0 | 48.0 | 0.4 | OK |
| p | Al | Al-7at % Cu—N | T | IZO | 250 | 50 | 50 | 44.0 | 36.0 | 32.0 | 0.4 | OK |
| q | Al | Al-7at % Cu—N | W | IZO | 250 | 50 | 50 | 20.0 | 1.8 | 0.7 | 0.4 | OK |
| r | Al | Al-7at % Cu—N | X | IZO | 250 | 50 | 50 | 80.0 | 88.0 | 76.0 | 0.4 | NG |

TABLE 3

| | Structure of lamination film | | | | | | | Reflectivity (%) | | | Sheet resistance Ω/□ | Wet etching processability |
|---|---|---|---|---|---|---|---|---|---|---|---|---|
| | Kind of each layer | | | | Film thickness of each layer (nm) | | | | | | | |
| | | Second layer | | | | | | | | | | |
| No. | First layer | Composition | Table 1 No. | Third layer | First layer | Second layer | Third layer | 450 nm | 550 nm | 650 nm | | |
| 27 | Al-0.2at % Cu | Al-17at % Cu—N | I | IZO | 250 | 50 | 50 | 11.7 | 15.9 | 17.4 | 0.2 | OK |
| 28 | Al-0.5at % Cu | Al-17at % Cu—N | I | IZO | 250 | 50 | 50 | 10.9 | 14.7 | 16.2 | 0.2 | OK |
| 29 | Al-1at % Ni-0.5at % Cu-0.3at % La | Al-17at % Cu—N | I | IZO | 250 | 50 | 50 | 12.8 | 16.6 | 17.1 | 0.4 | OK |
| 30 | Al-0.1at % Ni-0.5at % Ge-0.3at % La | Al-17at % Cu—N | I | IZO | 250 | 50 | 50 | 13.2 | 16.6 | 16.9 | 0.4 | OK |
| 31 | Al-0.2at % Nd | Al-17at % Cu—N | I | IZO | 250 | 50 | 50 | 12.1 | 16.4 | 16.9 | 0.3 | OK |
| 32 | Al-0.6at % Nd | Al-17at % Cu—N | I | IZO | 250 | 50 | 50 | 10.5 | 14.1 | 13.9 | 0.4 | OK |
| 33 | Al-2at % Nd | Al-17at % Cu—N | I | IZO | 250 | 50 | 50 | 11.3 | 16.9 | 16.9 | 0.6 | OK |
| 34 | Al-0.2at % Ta-0.2at % Nd | Al-17at % Cu—N | I | IZO | 250 | 50 | 50 | 10.8 | 15.1 | 15.6 | 0.5 | OK |
| 35 | Al-0.5at % Ta-0.2at % Nd | Al-17at % Cu—N | I | IZO | 250 | 50 | 50 | 10.2 | 14.8 | 14.8 | 0.7 | OK |
| 36 | Al-0.5at % Ta-0.2at % Nd-0.5at % Zr | Al-17at % Cu—N | I | IZO | 250 | 50 | 50 | 10.9 | 14.2 | 13.6 | 1.0 | OK |
| 37 | Al-0.5at % Ta-0.2at % Nd-0.5at % Zr-0.5at % Ge-0.5at % Ni | Al-17at % Cu—N | I | IZO | 250 | 50 | 50 | 10.4 | 13.2 | 13.4 | 1.2 | OK |
| 38 | Al-0.2at % Cu | Al-7at % Cu—N | U | IZO | 250 | 50 | 50 | 25.3 | 33.9 | 38.4 | 0.2 | OK |
| 39 | Al-0.5at % Cu | Al-7at % Cu—N | U | IZO | 250 | 50 | 50 | 24.9 | 33.9 | 38.2 | 0.2 | OK |
| 40 | Al-1at % Ni-0.5at % Cu-0.3at % La | Al-7at % Cu—N | U | IZO | 250 | 50 | 50 | 21.9 | 33.3 | 34.9 | 0.4 | OK |
| 41 | Al-0.1at % Ni-0.5at % Ge-0.3at % La | Al-7at % Cu—N | U | IZO | 250 | 50 | 50 | 23.1 | 34.0 | 34.7 | 0.4 | OK |
| 42 | Al-0.2at % Nd | Al-7at % Cu—N | U | IZO | 250 | 50 | 50 | 26.1 | 39.1 | 37.2 | 0.3 | OK |
| 43 | Al-0.6at % Nd | Al-7at % Cu—N | U | IZO | 250 | 50 | 50 | 25.5 | 36.4 | 36.9 | 0.4 | OK |
| 44 | Al-2at % Nd | Al-7at % Cu—N | U | IZO | 250 | 50 | 50 | 25.1 | 35.9 | 36.5 | 0.6 | OK |
| 45 | Al-0.2at % Ta-0.2at % Nd | Al-7at % Cu—N | U | IZO | 250 | 50 | 50 | 24.5 | 35.3 | 35.6 | 0.5 | OK |
| 46 | Al-0.5at % Ta-0.2at % Nd | Al-7at % Cu—N | U | IZO | 250 | 50 | 50 | 22.3 | 34.2 | 35.8 | 0.7 | OK |
| 47 | Al-0.5at % Ta-0.2at % Nd-0.5at % Zr | Al-7at % Cu—N | U | IZO | 250 | 50 | 50 | 20.9 | 31.9 | 33.7 | 1.0 | OK |
| 48 | Al-0.5at % Ta-0.2at % Nd-0.5at % Zr-0.5at % Ge-0.5at % Ni | Al-7at % Cu—N | U | IZO | 250 | 50 | 50 | 22.8 | 32.5 | 35.0 | 1.2 | OK |

TABLE 4

| Al alloy composition | Electrical resistivity μΩ · cm |
|---|---|
| Al—0.2 at % Cu | 4.8 |
| Al—0.5 at % Cu | 5.1 |
| Al—1 at % Ni—0.5 at % Cu—0.3 at % La | 12 |
| Al—0.1 at % Ni—0.5 at % Ge—0.3 at % La | 11 |
| Al—0.2 at % Nd | 5.8 |
| Al—0.6 at % Nd | 7.7 |
| Al—2 at % Nd | 13 |
| Al—0.2 at % Ta—0.2 at % Nd | 6.4 |
| Al—0.5 at % Ta—0.2 at % Nd | 7.5 |
| Al—0.5 at % Ta—0.2 at % Nd—0.5 at % Zr | 8.1 |
| Al—0.5 at % Ta—0.2 at % Nd—0.5 at % Zr—0.5 at % Ge—0.5 at % Ni | 12 |
| Al—1 at % Cu—1 at % Mn | 12 |
| Ag | 2 |
| Cu | 2.1 |

First, Table 1 is referred to. Table 1 shows the results of the refractive indices and the extinction coefficients of the Al—N layer or the Al—X alloy-N layers obtained by partially nitriding pure Al or various Al—X alloys (X alloy=Ti, Ta, Mn, or Cu). Incidentally, the results of the electrical resistivity are also shown together.

Table 1 indicates as follows. When the X group elements are the same elements, the extinction coefficient increases with an increase in content of the X group elements included in Al. It is indicated as follows: of these, the Al—Mn—N layer including Mn in an amount of 43 at % or more as the X group element is high in extinction coefficient at any wavelength region, and can be preferably used as the second layer in the present invention.

In contrast, the extinction coefficient of the Al—N layer obtained by partially nitriding pure Al is low at any wavelength region. Namely, it is indicated that AlN is not suitable as the second layer in the present invention.

Then, a consideration will be given based on Table 2 and Table 3.

Nos. 2 to 6, 8, 9, 11 to 16, 19, b, c, e to i, k to m, o to q of Table 2, and 27 to 48 of Table 3 are all the inventive examples satisfying the requirements of the present invention. Both the reflectivity and the sheet resistance of each lamination film were able to be controlled low. Further, the wet etching processability was also favorable.

In contrast, for No. 1 of Table 2, the film thickness of the first layer deviated from the preferable lower limit of 50 nm of the present invention, and was small, and hence the sheet resistance increased.

No. 7 of Table 2 is an example using Al-36 at % Mn—N of No. 5 of Table 1 as the second layer. When the film thickness of No. 7 is 200 nm, the reflectivity of the lamination film cannot be set at 50% or less. In order to reduce the reflectivity, the film thickness of the lamination layer is required to be set at 400 nm as with No. 8.

Whereas, Nos. a, d, j, n, and r of Table 2 each use a second layer with a small extinction coefficient as shown in Table 1. For this reason, the reflectivity of each lamination film was not able to be reduced to 50% or less. These indicate that Nos. A, D, M, R, and X of Table 1 formed with the examples of Table 2 are not suitable as the second layer in the present invention.

No. 10 of Table 2 is an example using Al-17 at % Cu—N as the second layer as with Nos. 11 to 15. However, as compared with Nos. 11 to 15, the film thickness of the second layer was smaller. For this reason, the reflectivity as in a lamination film increased.

Nos. 17 and 18 of Table 2 are each an example using Al-7 at % Cu—N as the second layer as with No. 19. However, as compared with No. 19, the film thickness of the second layer was smaller. For this reason, the reflectivity as in a lamination film increased.

No. 20 of Table 2 used Al—N as the second layer. For this reason, the reflectivities of the lamination film at all the wavelength regions of 450 nm, 550 nm, and 650 nm increased.

For No. 21 and No. 22 of Table 2, those satisfying the requirements specified in the present invention were used as the second layer and the third layer. However, as the first layer, Ag and Cu were used, respectively. Accordingly, the wet etching processability was reduced. Particularly, these satisfied the acceptability criteria of the present invention in terms of the reflectivity and the sheet resistance. However, the solubility to a phosphoric nitric acetic acid based etchant was high. For this reason, the first layer portion was overetched, resulting in a reduction of the processability.

Whereas, Nos. g to j of Table 2 are examples in which Al-17 at % Cu—N thin films of the second layers have been deposited by changing the nitrogen gas flow rate, and are different in nitrogen atom ratio as shown in Table 1. Comparison among Nos. g to j indicates as follows: even for Al-17 at % Cu—N including a relatively large amount of X group elements, and tending to obtain a large extinction coefficient, when the nitrogen atom ratio of the second layer increases, the extinction coefficient tends to decrease; and it is difficult to sufficiently suppress the reflectivity. The tendency to decrease in extinction coefficient with an increase in nitrogen atom ratio of the second layer is also observed for Nos. k to n of Table 2 in which the second layer is Al-12 at % Cu—N, and Nos. o to r in which the second layer is Al-7 at % Cu—N.

Table 3 shows the following examples: the first layers were formed of various components; however, for No. 27, No. 38, No. 28, and No. 39, or the like, the first layers were formed of the same components; and as each second layer, Al-17 at % Cu—N was formed for Nos. 27 to 37 of Table 3, and Al-7 at % Cu—N was formed for Nos. 38 to 48. Incidentally, for all of Nos. 27 to 48, the components of the third layer, the film thicknesses of the first layer to the third layer, and the deposition method of the second layer were set equal. In the Table 3, comparison among the examples having the same films as the first layers, and having different second layers like the combinations of, for example, No. 27 and No. 38, No. 28 and No. 39, and the like, and No. 37 and No. 48 indicates as follows. Nos. 27 to 37 each including Al-17 at % Cu—N with large extinction coefficients at all the wavelength regions of 450 nm, 550 nm, and 650 nm as in the Table 1 formed as the second layer were more suppressed in reflectivity than the lamination films of Nos. 38 to 48.

Figure 23:
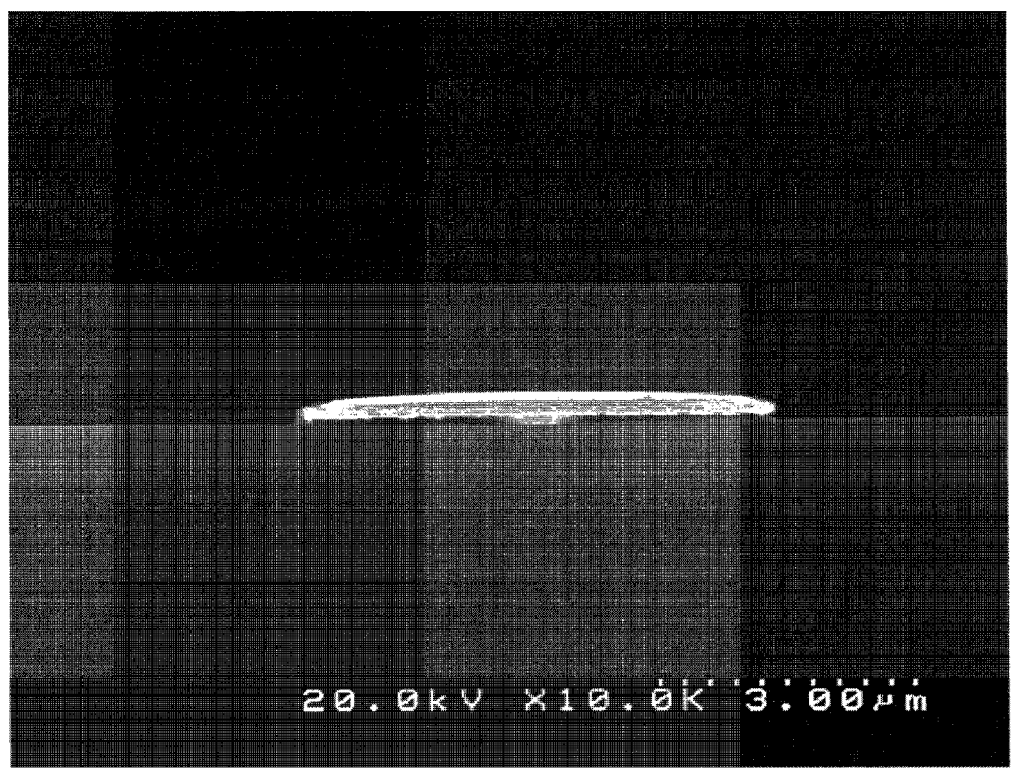
FIG. 23 is a view showing the cross sectional shape when the lamination film of No. 21 of Table 2 (the comparative example) is patterned with a phosphoric nitric acetic acid based etchant.

FIGS. 21 to 23 each show the cross sectional shape after wet etching processing by a phosphoric nitric acetic acid based etchant for each of No. 4 (inventive example, FIG. 21), No. 16 (inventive example, FIG. 22), and No. 21 (Comparative Example, FIG. 23) of Table 2. As shown in the drawings, it is indicated that the cross sectional shape after wet etching processing largely varies according to the kind of the first layer. Particularly, it is indicated as follows: by using the first layer preferably used in the present invention as with No. 4 and No. 16 of Table 2 using Al-1.0 at % Cu-1.0 at % Mn for the first layer, the forward tapered shape is obtained, and the wet etching processability is excellent in all cases. In contrast, it is indicated as follows: when Ag is used as the first layer as with No. 21 of Table 2, the Ag thin film portion is largely overetched.

Example 2

In the present example, samples of a structure in which a third layer, a second layer, and a first layer were stacked sequentially from the transparent substrate side, or a structure in which a second layer and a first layer were stacked sequentially from the transparent substrate side were formed in the following manner.

(1) Formation of Sample
(1-1) Deposition of Third Layer

First, a non-alkali glass sheet (0.7 mm in thickness, 4 inches in diameter) was used as the transparent substrate. On the surface, each third layer shown in Table 5 or Table 6 was deposited by a DC magnetron sputtering method. For deposition, the atmosphere in a chamber was once adjusted to an ultimate vacuum: $3 \times 10^{-6}$ Torr before deposition. Then, using a disc-shaped IZO sputtering target with a diameter of 4 inches having the same composition as that of the transparent conductive film, sputtering was performed under the following conditions.

(Sputtering Conditions)
Gas pressure: 2 mTorr
Ar gas flow rate: 18 sccm
$O_2$ gas flow rate: 1 sccm
Sputtering power: 250 W
Substrate temperature: room temperature (1-2) Deposition of second layer Using an alloy target with a desired composition so that the second layer has each composition described in Table 5 or Table 6, deposition by a reactive sputtering method with a nitrogen gas was performed under the following conditions.

(Reactive Sputtering Conditions)
Ar gas pressure: 2 mTorr
Ar gas flow rate: 10 sccm
Nitrogen gas flow rate: 5 sccm
Sputtering power: 500 W
Substrate temperature: room temperature (1-3) Deposition of First Layer As described above, as the Al—X alloy-N layer of the second layer, an Al—Cu alloy-N layer was deposited. Then, subsequently, on the surface, each first layer shown in Table 5 or Table 6 was deposited by a DC magnetron sputtering method. For deposition, the atmosphere in a chamber was once adjusted to an ultimate vacuum: $3 \times 10^{-6}$ Torr before deposition. Then, using a disc-shaped sputtering target with a diameter of 4 inches having the same composition as that of the metal film, sputtering was performed under the following conditions.

(Sputtering Conditions)
Ar gas pressure: 2 mTorr
Ar gas flow rate: 30 sccm
Sputtering power: 250 W
Substrate temperature: room temperature Then, using each obtained sample, the reflectivity of the lamination film, and the sheet resistance of the lamination film were measured, and the wet etching processability by a phosphoric nitric acetic acid based etchant of the lamination film was evaluated in the same manner as in Example 1. The results are shown together in Table 5 or Table 6.

TABLE 5

| | Structure of lamination film | | | | Film thickness of each layer (nm) | | | Reflectivity (%) | | | Sheet resistance Ω/□ | Wet etching processability |
|---|---|---|---|---|---|---|---|---|---|---|---|---|
| | Kind of each layer | | | | | | | | | | | |
| | | Second layer | | | | | | | | | | |
| No. | Third layer | Composition | Table 1 No. | First layer | Third layer | Second layer | First layer | 450 nm | 550 nm | 650 nm | | |
| 1 | IZO | Al-7at % Cu—N | U | Al-1at % Cu-1at % Mn | 40 | 30 | 250 | 7.3 | 7.2 | 10.7 | 0.5 | OK |
| 2 | IZO | Al-7at % Cu—N | U | Al-1at % Cu-1at % Mn | 40 | 60 | 250 | 6.4 | 8.2 | 10.1 | 0.5 | OK |
| 3 | IZO | Al-7at % Cu—N | U | Al-1at % Cu-1at % Mn | 45 | 40 | 250 | 6.8 | 4.9 | 5.5 | 0.5 | OK |
| 4 | IZO | Al-7at % Cu—N | U | Al-1at % Cu-1at % Mn | 45 | 60 | 250 | 6.9 | 6.3 | 7.7 | 0.5 | OK |
| 5 | IZO | Al-7at % Cu—N | U | Al-1at % Cu-1at % Mn | 50 | 50 | 250 | 8.4 | 5.2 | 5.6 | 0.5 | OK |
| 6 | IZO | Al-7at % Cu—N | U | Al-1at % Cu-1at % Mn | 55 | 40 | 250 | 10.9 | 6.1 | 5.5 | 0.5 | OK |
| 7 | IZO | Al-7at % Cu—N | U | Al-1at % Cu-1at % Mn | 60 | 30 | 250 | 17.6 | 12.4 | 11.8 | 0.5 | OK |
| 8 | IZO | Al-7at % Cu—N | U | Al-1at % Cu-1at % Mn | 60 | 40 | 250 | 12.8 | 7.2 | 5.9 | 0.5 | OK |
| 9 | IZO | Al-7at % Cu—N | U | Al-1at % Cu-1at % Mn | 60 | 60 | 250 | 14.6 | 7.1 | 6.0 | 0.5 | OK |
| 10 | — | Al-7at % Cu—N | U | Al-1at % Cu-1at % Mn | 0 | 50 | 250 | 19.3 | 17.9 | 16.3 | 0.5 | OK |
| 11 | IZO | Al-7at % Cu—N | U | Al-1at % Cu-1at % Mn | 50 | 50 | 250 | 35.2 | 35.1 | 40.2 | 0.5 | OK |

TABLE 6

| | Structure of lamination film | | | | Film thickness of each layer (nm) | | | Reflectivity (%) | | | Sheet resistance Ω/□ | Wet etching processability |
|---|---|---|---|---|---|---|---|---|---|---|---|---|
| | Kind of each layer | | | | | | | | | | | |
| | | Second layer | | | | | | | | | | |
| No. | Third layer | Composition | Table 1 No. | First layer | Third layer | Second layer | First layer | 450 nm | 550 nm | 650 nm | | |
| 12 | IZO | Al-7at % Cu—N | U | Al-0.2at % Cu | 50 | 50 | 250 | 8.6 | 5.8 | 5.9 | 0.2 | OK |
| 13 | IZO | Al-7at % Cu—N | U | Al-0.5at % Cu | 50 | 50 | 250 | 8.4 | 5.5 | 5.6 | 0.2 | OK |
| 14 | IZO | Al-7at % Cu—N | U | Al-1at % Ni-0.5at % Cu-0.3at % La | 50 | 50 | 250 | 8.3 | 6.0 | 5.9 | 0.4 | OK |
| 15 | IZO | Al-7at % Cu—N | U | Al-0.1at % Ni-0.5at % Ge-0.3at % La | 50 | 50 | 250 | 8.4 | 5.9 | 6.0 | 0.4 | OK |
| 16 | IZO | Al-7at % Cu—N | U | Al-0.2at % Nd | 50 | 50 | 250 | 8.3 | 6.3 | 6.6 | 0.3 | OK |
| 17 | IZO | Al-7at % Cu—N | U | Al-0.6at % Nd | 50 | 50 | 250 | 8.3 | 6.5 | 6.5 | 0.4 | OK |
| 18 | IZO | Al-7at % Cu—N | U | Al-2at % Nd | 50 | 50 | 250 | 8.1 | 5.5 | 5.6 | 0.6 | OK |
| 19 | IZO | Al-7at % Cu—N | U | Al-0.2at % Ta-0.2at % Nd | 50 | 50 | 250 | 8.3 | 5.4 | 5.3 | 0.5 | OK |
| 20 | IZO | Al-7at % Cu—N | U | Al-0.5at % Ta-0.2at % Nd | 50 | 50 | 250 | 8.3 | 5.5 | 5.5 | 0.7 | OK |
| 21 | IZO | Al-7at % Cu—N | U | Al-0.5at % Ta-0.2at % Nd-0.5at % Zr | 50 | 50 | 250 | 8.2 | 5.1 | 5.5 | 1.0 | OK |
| 22 | IZO | Al-7at % Cu—N | U | Al-0.5at % Ta-0.2at % Nd-0.5at % Zr-0.5at % Ge-0.5at % Ni | 50 | 50 | 250 | 8.1 | 5.1 | 5.4 | 1.2 | OK |

From Tables 5 and 6, for all of Nos. 1 to 22, those satisfying the requirements specified in the present invention were used as the first layer and the second layer, and further, the third layer satisfying the recommended requirements was formed. Accordingly, both of the reflectivity and the sheet resistance of each lamination film were able to be controlled low. Further, the wet etching processability was also favorable.

Incidentally, in Table 5, particularly, the lamination films were formed by changing the film thicknesses of the second layer and the third layer. The results of Table 5 indicate that the reflectivity tended to increase with a decrease in wavelength. It is considered that the reflectivities at a wavelength of 550 nm and a wavelength of 650 nm were affected by not only the third layer but also the second layer. In the examples of Table 5, it is indicated that the reflectivities at a wavelength of 550 nm and a wavelength of 650 nm could be controlled lower with a film thickness of the third layer within the range of 45 to 60 nm and a film thickness of the second layer within the range of 40 to 60 nm.

LIST OF REFERENCE SIGNS

1 Liquid crystal display device
2 TFT substrate
3 Opposing substrate
4 Color filter substrate
5A, 5B, 5C Color filter
6 Black matrix
7 Liquid crystal layer
8 Liquid crystal sealing material
10 Input device
11 First metal electrode, driving electrode
12 Second metal electrode, detecting electrode
13 Insulation layer
13A First insulation layer
13B Second insulation layer
14 Cover glass
15 Backlight
20A, 20B, 20C, 20D, 20E, 20F, 20G, 20H, 20I, 20J, 20K, 20L, 20M Electrode structure
21 First layer
22 Second layer
23 Third layer
24 Transparent substrate
25 Mo film
26 Transparent electrode
30 Input device
31A First electrode pattern
31B First bridge electrode
31C Peripheral wire of first electrode
32A Second electrode pattern
32B Second bridge electrode
32C Peripheral wire of second electrode
33 Transparent substrate
40 Liquid crystal display device
41 Cover glass
42 Touch panel
43 Display
44 Adhesion layer
50 Cross sectional structure
52A First transparent electrode
52B First bridge electrode
53 Second transparent electrode
54 Insulation layer

The invention claimed is:

1. An electrode, comprising
a lamination structure comprising:
a first layer including an Al film or an Al alloy film,
a second layer including a partially nitrided Al alloy including Al,
at least one element selected from the group consisting of Mn, Cu, Ti, and Ta, and
nitrogen in an amount of 14 at % or more and 57 at % or less, and
a third layer, which is a transparent conductive film, wherein
the second layer has extinction coefficients of 0.15 or more at a wavelength of 450 nm, a wavelength of 550 nm, and a wavelength of 650 nm, and
the third layer is a transparent conductive film formed of an oxide including at least In and Sn, or a transparent conductive film formed of an oxide including at least In and Zn.

2. The electrode according to claim 1, further comprising a Mo film on at least one surface of the first layer.

3. The electrode according to claim 1, wherein the Al alloy of the second layer includes at least one element selected from the group consisting of Mn and Cu.

4. The electrode according to claim 1, wherein the electrical resistivity of the first layer is 20 $\mu\Omega \cdot$cm or less.

5. The electrode according to claim 1, wherein the first layer includes the Al alloy film, which includes Al; and at least one element selected from the group consisting of Nd, Cu, Mn, Ta, Ge, La, Zr, and Ni.

6. The electrode according to claim 1, wherein the first layer has a film thickness of 50 to 400 nm.

7. An input device, comprising
the electrode according to claim 1.

8. A touch panel sensor, comprising
the electrode according to claim 1.

9. A sputtering target for depositing the second layer forming the electrode according to claim 1, the sputtering target comprising
at least one element selected from the group consisting of Mn, Cu, Ti, and Ta;
Al; and
unavoidable impurities.

10. A method for producing the electrode according to claim 1, the method comprising:
depositing the second layer by a reactive sputtering method including a nitrogen gas.

11. The electrode according to claim 1, wherein the second layer includes Mn, an amount of which is 30 at % or more and 80 at % or less.

12. The electrode according to claim 1, wherein the second layer includes Cu, an amount of which is 5 at % or more and 30 at % or less.

13. The electrode according to claim 1, wherein the second layer includes Ti, an amount of which is 1 at % or more and 20 at % or less.

14. The electrode according to claim 1, wherein the second layer includes Ta, an amount of which is 5 at % or more and 30 at % or less.

15. The electrode according to claim 5, wherein a total amount of the at least one element is 0.1 at % or more and 3 at % or less.

* * * * *